United States Patent
Kim et al.

(10) Patent No.: US 9,093,171 B2
(45) Date of Patent: Jul. 28, 2015

(54) METHOD OF OPERATING A NONVOLATILE MEMORY DEVICE HAVING READ DISTURBED PAGE

(71) Applicant: SAMSUNG ELECTRONICS CO., LTD., Suwon-Si, Gyeonggi-Do (KR)

(72) Inventors: Si-Hwan Kim, Seongnam-si (KR); Sang-Yong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/467,899

(22) Filed: Aug. 25, 2014

(65) Prior Publication Data

US 2015/0055411 A1    Feb. 26, 2015

(30) Foreign Application Priority Data

Aug. 26, 2013  (KR) .................. 10-2013-0100924

(51) Int. Cl.
*G11C 11/56*  (2006.01)
*G11C 16/34*  (2006.01)
*G11C 16/10*  (2006.01)
*G11C 16/04*  (2006.01)

(52) U.S. Cl.
CPC ........ *G11C 16/3404* (2013.01); *G11C 11/5628* (2013.01); *G11C 11/5642* (2013.01); *G11C 16/0483* (2013.01); *G11C 16/10* (2013.01); *G11C 16/3459* (2013.01); *G11C 2211/5641* (2013.01); *G11C 2211/5644* (2013.01)

(58) Field of Classification Search
CPC ........... G11C 16/3404; G11C 16/3459; G11C 16/0483; G11C 11/5628; G11C 11/5642; G11C 16/10; G11C 2211/5644; G11C 2211/5641
USPC ............. 356/185.02, 185.03, 185.18, 185.24, 356/210.12
See application file for complete search history.

(56) References Cited

U.S. PATENT DOCUMENTS

| | | | |
|---|---|---|---|
| 8,281,220 B2 | 10/2012 | Kitahara | |
| 2006/0209596 A1 | 9/2006 | Li | |
| 2007/0285980 A1* | 12/2007 | Shimizu et al. | 365/185.03 |
| 2008/0055981 A1 | 3/2008 | Joo | |
| 2009/0216936 A1 | 8/2009 | Chu et al. | |
| 2011/0205793 A1 | 8/2011 | Huang | |

FOREIGN PATENT DOCUMENTS

KR    10-2006-0109697    10/2006

* cited by examiner

*Primary Examiner* — Pho M Luu
*Assistant Examiner* — Ajay Ojha
(74) *Attorney, Agent, or Firm* — Volentine & Whitt, PLLC

(57) ABSTRACT

A method of operating a nonvolatile memory device by programming pages using a N-bit programming mode until a threshold voltage distribution shift for an un-programmed page in the same memory block is determined, and thereafter programming the un-programmed page using a M-bit programming mode, where M is less than N.

17 Claims, 24 Drawing Sheets

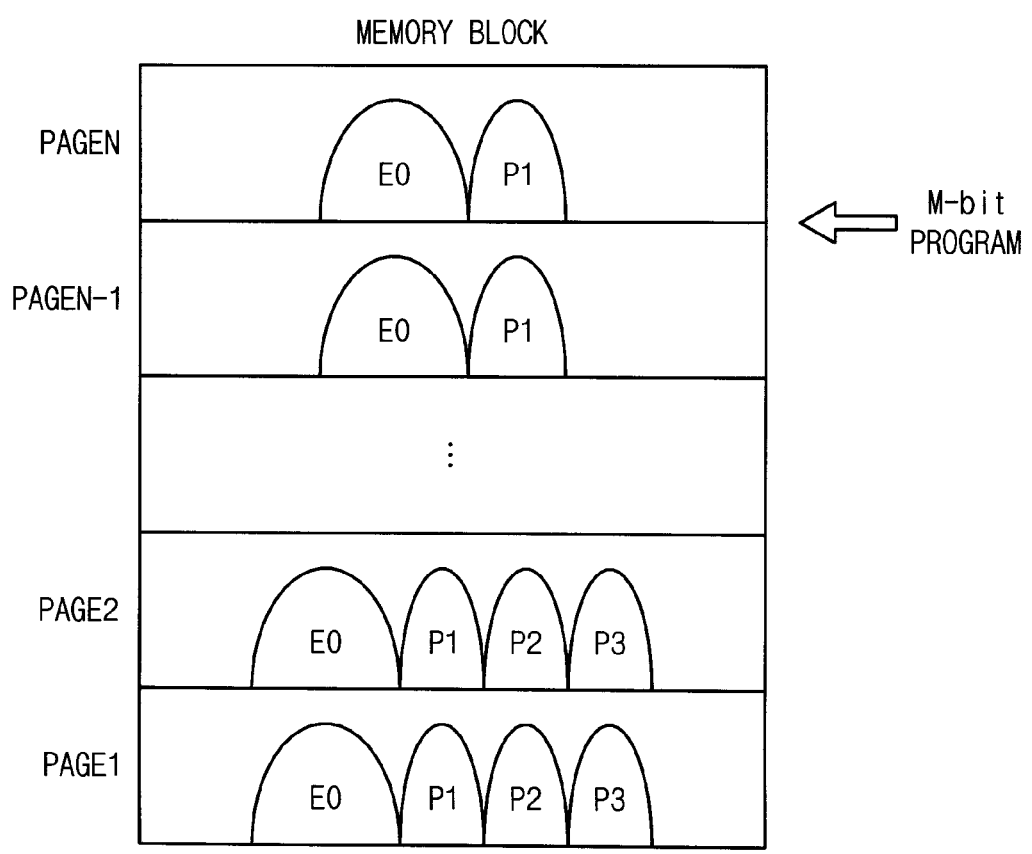

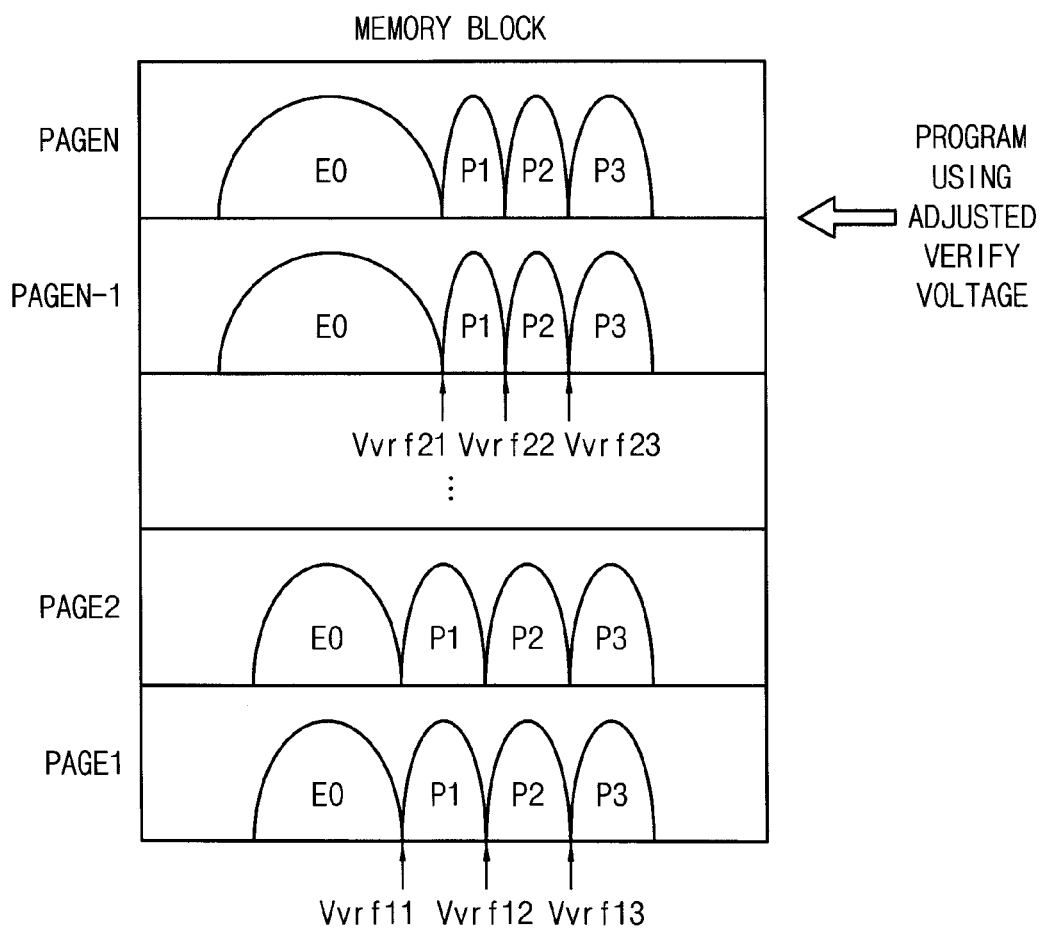

METHOD OF OPERATING A NONVOLATILE MEMORY DEVICE HAVING READ DISTURBED PAGE

CROSS-REFERENCE TO RELATED APPLICATIONS

This U.S. non-provisional application claims priority under 35 U.S.C. §119 to Korean Patent Application No. 10-2013-0100924 filed on Aug. 26, 2013, the subject matter of which is hereby incorporated by reference.

BACKGROUND

The inventive concept relates generally to nonvolatile memory devices and, more particularly, to methods of operating nonvolatile memory devices.

Data is programmed to and read from the individual memory cells of a nonvolatile memory device in accordance with a plurality of threshold voltage distributions. That is, respective threshold voltage distributions are assigned a corresponding logic state.

Nonvolatile memory cells may be configured as single-level memory cells (SLC) capable of storing one bit of data per SLC, or as multi-level memory cells (MLC) capable of storing two or more bits per MLC. As the number of bits ("k") stored by MLC increases, the number of corresponding program states (and associated threshold voltage distributions) increases according to the relationship "$2^k$". As a result the voltage level widths of respective threshold voltage distributions used to program MLC can become quite narrow. That is, given a maximum threshold voltage range for a MLC, this range must be ever more finely partitioned into coherent threshold voltage distributions, each respectively associated with a corresponding data state.

To better manage the programming, reading, erasing, and/or storing of data, the memory cell arrays of contemporary nonvolatile memory devices are divided in a number of memory blocks, where each memory block is further divided into a plurality of pages. This division of blocks and pages may be made in view of logical data definitions and/or the physical layout of memory cells in a memory cell array. Data is usually programmed/read according to page units while data is erased according to block units.

Circumstances often arise wherein some of the pages in a given block have been programmed, but other pages remain un-programmed (i.e., remain in an erased state). Under these conditions, one or more read operations may be directed to memory cells of the "programmed pages". Unfortunately, under the stress or influence of executing such read operations, the threshold voltage distribution of the memory cells in the "un-programmed pages" may be undesirably shifted (or broadened). This effect is a type of read disturbance. In extreme cases of read disturbance, when a program operation is subsequently directed to one of the un-programmed pages—now having memory cells with shifted threshold voltage distribution(s) being interpreted as fail bits (e.g., erroneously programmed bits)—the program operation may fail.

SUMMARY

Embodiments of the inventive concept provides operating methods for nonvolatile memory devices and systems including nonvolatile memory devices that more efficiently use available the memory space provided by various blocks of memory cells in the nonvolatile memory device.

According to certain embodiments, the inventive concept provides a method of operating a nonvolatile memory device having a memory cell array of nonvolatile memory cells configured to operate as multi-level memory cells (MLC) and arranged in a memory block including a plurality of pages respectively coupled to a plurality of word lines extending across the memory cell array. The method includes; programming N-bit data to MLC of at least a first page among the plurality of pages using a N-bit mode, wherein "N" is a natural number greater than 1 and the plurality of pages includes an un-programmed page, checking whether a threshold voltage distribution shift exists for the un-programmed page, and upon determining that the threshold voltage distribution shift exits, programming M-bit data to the MLC of the un-programmed page using a M-bit mode, where "M" is a natural number less than N.

According to certain embodiments, the inventive concept provides a method of operating a nonvolatile memory device including a memory block including a plurality of pages including an un-programmed page. The method includes; programming at least one page of the plurality of pages using at least one first verify voltage associated with a N-bit programming mode, where "N" is a natural number greater than 1, checking whether a threshold voltage distribution shift exists for the un-programmed page, and upon determining that the threshold voltage distribution shift exits, programming the un-programmed page using at least one second verify voltage higher than the at least one first verify voltage and associated with a M-bit programming mode, where "M" is a natural number less than N.

According to certain embodiments, the inventive concept provides a method of operating a nonvolatile memory device having a memory cell array of nonvolatile memory cells configured to operate as multi-level memory cells (MLC) and arranged in a memory block including a plurality of pages respectively coupled to a plurality of word lines extending across the memory cell array. The method includes; programming N-bit data to MLC of a first page among the plurality of pages using a N-bit programming mode, wherein "N" is a natural number greater than 1 and the plurality of pages includes an un-programmed page, after programming the N-bit data to the MLC of the first page, counting a number of read operations directed to the MLC of the first page, and comparing the number of counted read operations to a limit, and upon determining that the number of counted read operations exceeds the limit, programming M-bit data to MLC of the un-programmed page using a M-bit programming mode, where "M" is a natural number less than N.

According to certain embodiments, the inventive concept provides a method of operating system including a memory controller controlling the operation of a nonvolatile memory device, wherein the nonvolatile memory device includes a memory cell array of nonvolatile memory cells configured to operate as multi-level memory cells (MLC) and arranged in a memory block including a plurality of pages respectively coupled to a plurality of word lines extending across the memory cell array. The method includes; programming pages among of the plurality of pages using a N-bit programming mode until a threshold voltage distribution shift for an un-programmed page among the plurality of pages is determined, and thereafter programming the un-programmed page using a M-bit programming mode, where "M" and "N" are natural numbers and M is less than N.

BRIEF DESCRIPTION OF THE DRAWINGS

Illustrative embodiments of the inventive concept are shown in relevant portion in the accompanying drawings.

DETAILED DESCRIPTION

Various embodiments of the inventive concept will be described in some additional detail with reference to the accompanying drawings. The inventive concept may, however, be embodied in many different forms and should not be construed as being limited to the only the illustrated embodiments. Throughout the written description and drawings, like reference numbers and labels are used to denote like or similar elements.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
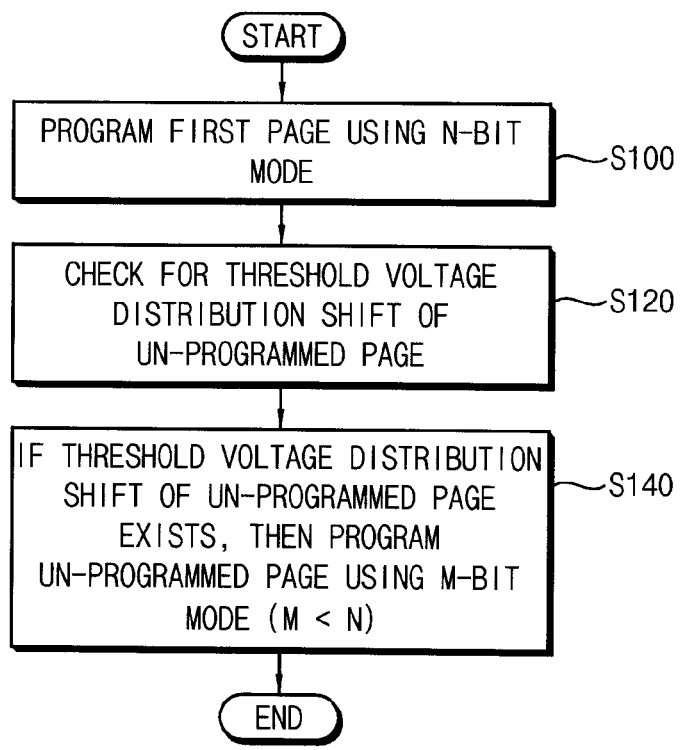
FIG. 1 is a flow chart summarizing a method of operating a nonvolatile memory device according to certain embodiments of the inventive concept.

FIG. 1 is a flow chart summarizing in one example a method of operating a nonvolatile memory device according to embodiments of the inventive concept. FIG. 2 is a conceptual diagram further illustrating the shifting of threshold voltage distributions of respective pages included in a memory block and application of the method of FIG. 1 to this situation.

Referring to FIG. 1, operation of a nonvolatile memory device including a memory block having a plurality of pages, where each page includes memory cells commonly connected to a word line is assumed. It is further assumed that the memory cells of the nonvolatile memory device are capable of being configured for operation as N-bit MLC, where "N" is a natural number greater than 1. Still further, it is assumed that the nonvolatile memory device may be normally operated according to an N-bit programming mode wherein N bits of data are programmed per MLC during a program operation, and that the nonvolatile memory device may also be normally operated according to an N-bit reading mode wherein N bits of data are read from each MLC during a read operation. These operating capabilities (individually or collectively) will hereafter be referred to as an "N-bit mode" of operation.

Figure 2A:
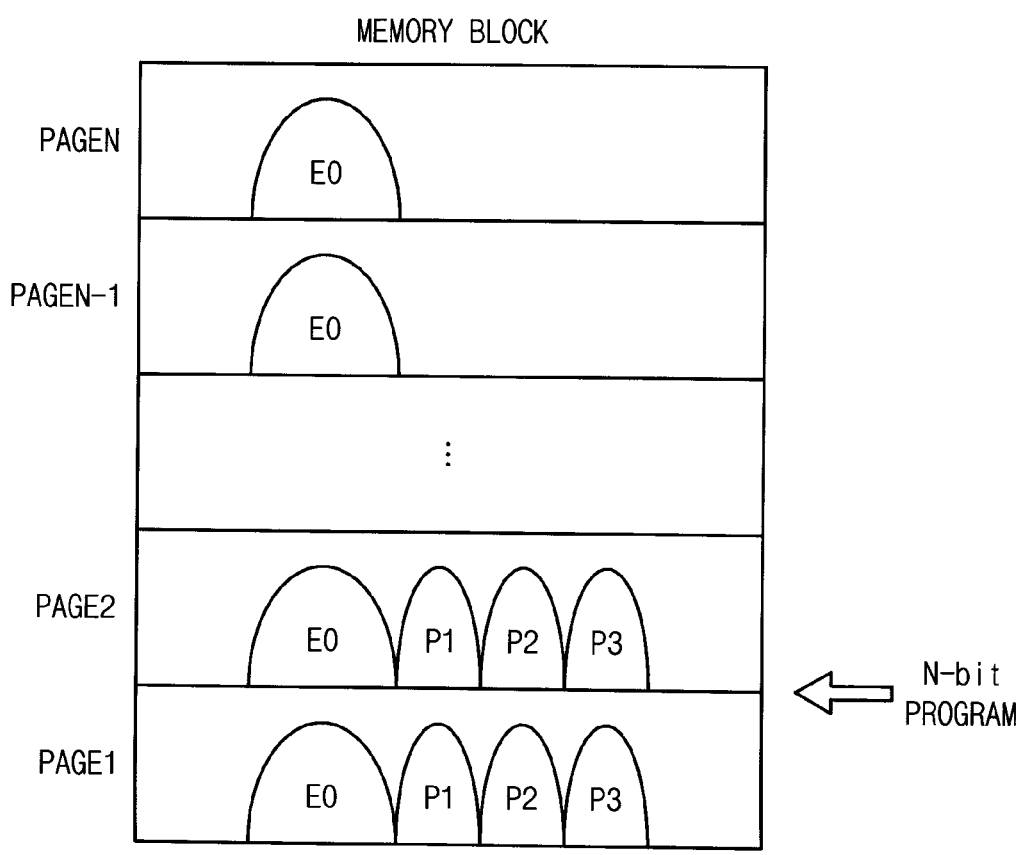
FIG. 2, inclusive of FIGS. 2A, 2B and 2C, is a conceptual diagram illustrating the read disturbance shifting of threshold voltage distributions for respective pages in a memory block and the results of applying a method of operating a nonvolatile memory device according to embodiments of the inventive concept.

With these assumptions in place, the method of FIG. 1 begins by programming data to at least a first page of the memory block using an N-bit mode (S100). Thus, the example illustrated in FIG. 2A shows two (2) pages (PAGE1 and PAGE2) being "programmed pages" among the plurality of pages making up the memory block, while at least pages PAGEN-1 and PAGEN remain "un-programmed pages" of the memory block. Here, "N" is assumed to be 2 (i.e., a 2-bit mode is used to program PAGE1 and PAGE2), and the memory cells of PAGE1 and PAGE2 may variously be programmed to have respective threshold voltage distributions associated with an erased state E0, a first program state P1, a second program state P2 and a third program state P3. In contrast, all of the memory cells arranged in PAGEN-1 and PAGEN remain un-programmed in the erased stage E0.

After at least the first page of the memory block has been programmed using the N-bit mode (which may be set as a default programming mode for the nonvolatile memory device), one or more read operation(s) are directed to memory cells of the at least one programmed page(s) (e.g., PAGE1 and/or PAGE2).

Figure 2B:
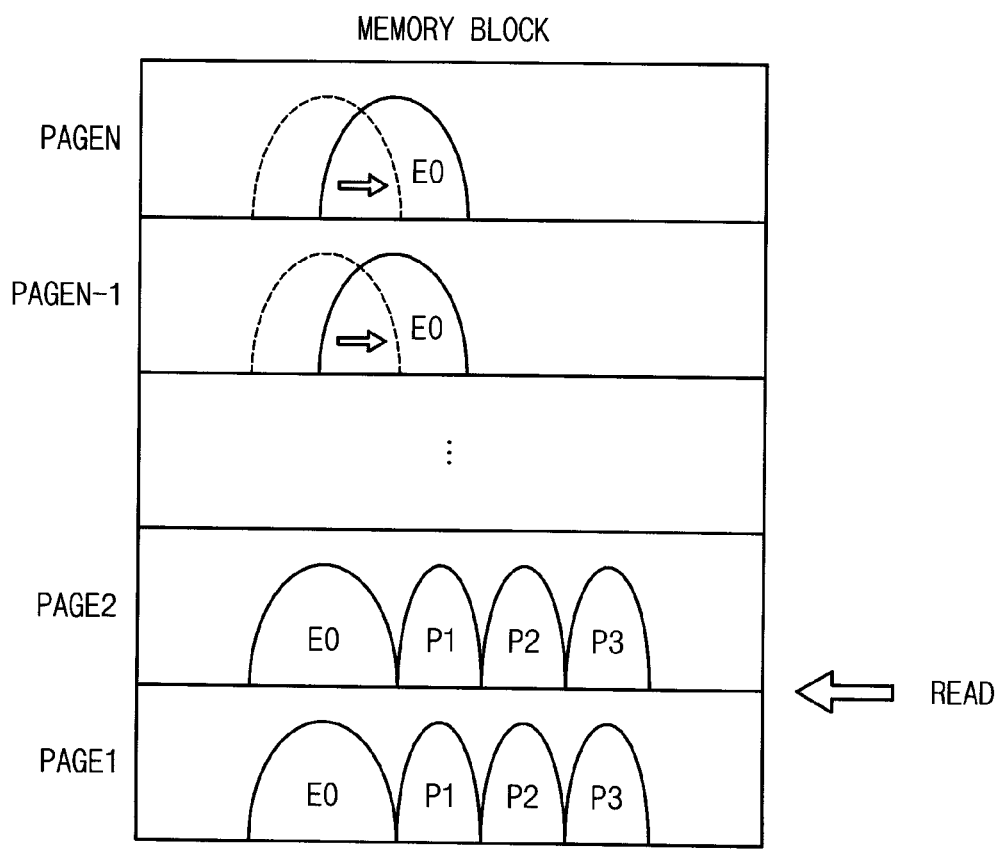

As has been noted above, the execution of one or more read operations performed with respect to a memory block including both programmed pages and un-programmed pages tends to "read disturb" the threshold voltage distribution (ideally stable at E0) of the memory cells in the un-programmed pages (e.g., shift the threshold voltage distribution higher and/or broaden the width of the threshold voltage distribution as illustrated in FIG. 2B).

That is, when a read operation directed to the programmed pages PAGE1 and PAGE2 is performed, read pass voltages (Vread) are applied to word lines that are also associated with the un-programmed pages PAGEN-1 and PAGEN. Coincident application of read pass voltages to these word lines disturbs the erased state voltage distribution (E0) for the memory cells of un-programmed pages PAGEN-1 and PAGEN. Once shifted beyond a certain limit, the "shifted threshold voltage distributions" of the memory cells of un-programmed pages PAGEN-1 and PAGEN will be interrupted as erroneously programmed data (or fail bits), and subsequent program operation(s) directed to the un-programmed pages PAGEN-1 and PAGEN—now including the fail bits—may result in a program fail result. Conventionally, such an outcome often results in the entire memory block being deemed a "bad block". Once deemed a bad block, the data stored in the programmed pages (e.g., PAGE1 and PAGE2) must be copied to another memory block and now designated bad block is removed from use by the nonvolatile memory device. These outcomes reduce overall memory performance.

Recognizing this undesirable conventional outcome, embodiments of the inventive concept check for the presence of a threshold voltage distribution shift in the memory cells of an un-programmed page before seeking to program the un-programmed page (S120). Various approaches may be used to check for a shifted threshold voltage distribution of an un-programmed page.

For example, a nonvolatile memory device consistent with an embodiment of the inventive concept may use a shift check voltage to essentially count a number of off-cells among all of the memory cells of an un-programmed page. Here, an off-cell is defined as a memory cell having a threshold voltage that is higher than the shift check voltage. If the number of off-cells is determined to exceed a maximum limit, the nonvolatile memory device may determine that a threshold voltage distribution shift for the un-programmed page exists.

Alternately or additionally, a nonvolatile memory device consistent with an embodiment of the inventive concept may count a number of read operations directed to programmed pages of the memory block. Should the number of the counted read operations exceed a maximum limit, the nonvolatile memory device may determine that a threshold voltage distribution shift for an un-programmed page probably exists.

However, the existence of a threshold voltage distribution shift for an un-programmed page is made, a nonvolatile memory device consistent with an embodiment of the inventive concept may respond by programming the un-programmed page using an M-bit mode, where "M" is a natural number less than N (S140).

For example, as illustrated in FIG. 2C, if the threshold voltage distributions of memory cells of un-programmed pages PAGEN-1 and PAGEN are determined to be shifted as the result of read operation(s) directed to programmed pages PAGE1 and PAGE2, the nonvolatile memory device may then select a 1-bit programming mode (M=1) to program pages PAGEN-1 and PAGEN.

Of course, pages programmed using a M-bit programming mode, as compared with the N-bit programming mode, must subsequently be read using a compatible M-bit reading mode. As the result in the foregoing example, the memory cells of the un-programmed pages deemed to have a shifted threshold voltage distribution may be thereafter be configured and operated as SLC using only an appropriately defined erased state E0 and first program state P1.

For the foregoing, those skilled in the art will appreciate that a conventional nonvolatile memory device will use the program/read mode for all pages of the memory block without taking into account the possible effects of read disturbance. Assuming an attempt by a conventional nonvolatile memory device to program the un-programmed pages illustrated above in FIG. 2 using the normal 2-bit programming mode that requires four (4) states E0, P1, P2 and P3, one may readily see that insufficient read margins will result making accurate discrimination of data values all but impossible.

However, nonvolatile memory devices according to embodiments of the inventive concept recognize that the shifted threshold voltage distribution of the un-programmed pages need not render the memory cells of these pages useless—let alone the entire memory block. Rather, a less demanding mode of operation may be selected for programming the memory cells of the un-programmed pages and sufficient margin between (e.g.,) an erased state E0 and the program state P1 may be ensured. Accordingly, a useful program/read operations may be directed to the memory cells of the un-programmed pages PAGEN-1 and PAGEN without loss of data integrity.

Although the illustrated example of FIG. 2 assumes a case wherein N=2 and M=1, this need not always be so. Rather, "N" may be any reasonable number of bits contemplated by a competent programming/read mode, and "M" need only be one or more bit(s) less than N in other embodiments of the inventive concept.

Figure 3:
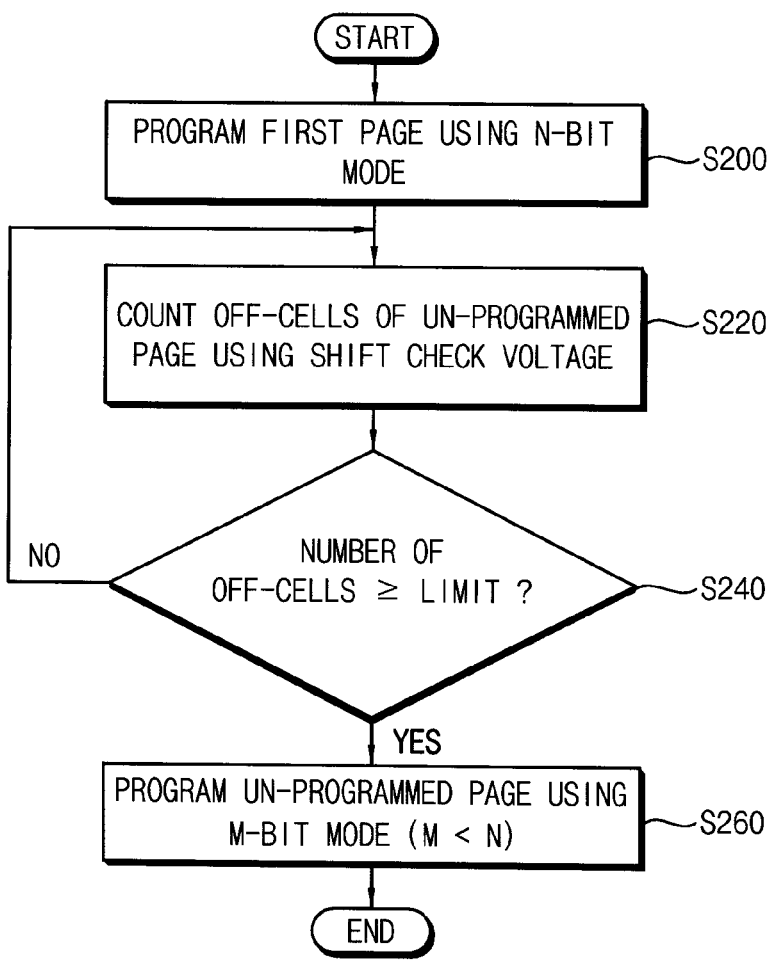
FIG. 3 is a flow chart summarizing a method of operating a nonvolatile memory device according to certain embodiments of the inventive concept.
Figure 4:
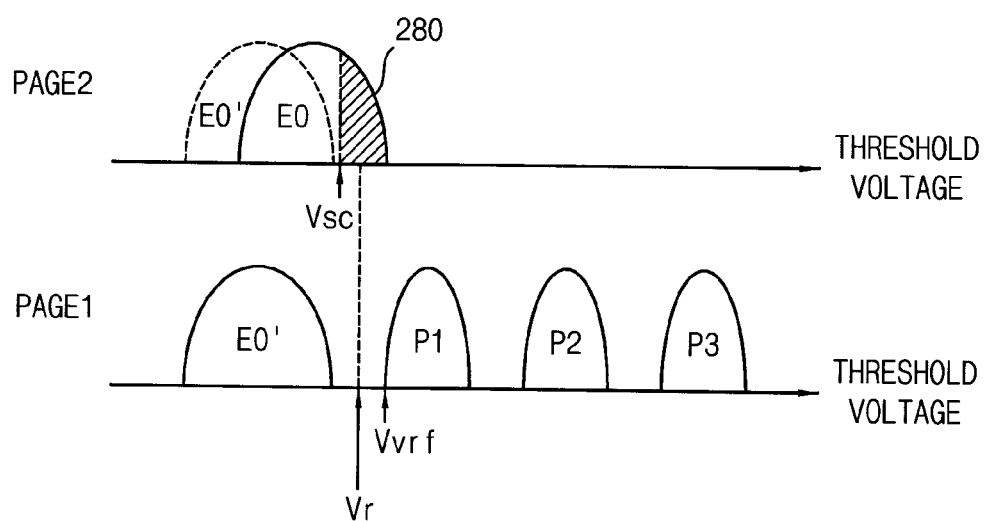
FIG. 4 is a conceptual diagram further illustrating the step of counting off-cells using a shift check voltage in the method of FIG. 3.

FIG. 3 is flow chart summarizing in another example a method of operating a nonvolatile memory device according to embodiments of the inventive concept. FIG. 4 is a voltage diagram further illustrating the step of counting off-cells using a shift check voltage in the method of FIG. 3. FIG. 5 is a conceptual diagrams further illustrating over a period of time the execution of a check operation used to determine whether or not a threshold voltage distribution shift has occurred by counting off-cells using the method of FIG. 3.

Referring to FIG. 3 the same general assumptions are made as were made in relation to the method and enabling nonvolatile memory device as FIG. 1. Thus, here again, the method begins by programming at least a first page of a memory block using a N-bit mode (S200). Then, one or more executed read operation(s) are directed to the memory cells of the at least first page, thereby raising the possibility of a read disturbance to the un-programmed pages of the memory block.

As a result, the nonvolatile memory device may count the number of off-cells having threshold voltages higher than a shift check voltage among the memory of an un-programmed page by (e.g.,) applying the shift check voltage to a word line coupled to the memory cells of the un-programmed page (S220).

For example, as illustrated in FIG. 4, a first page PAGE1 is assumed to be programmed using a 2-bit mode, such that each memory cell of the first page PAGE1 is variously programmed according to one of the erased state E0, first program state P1, second program state P2, or third program state P3. Now, assuming one or more read operation(s) were directed to the memory cells of the first page PAGE1, the desired erased state threshold voltage distribution (E0') for one or more of the memory cells of the un-programmed second page PAGE2 may have been shifted to (e.g.,) a shifted erased state threshold voltage distribution (E0). In the illustrated example, the shifted erased state threshold voltage (E0') partially exceeds an established read voltage (Vr) used to distinguish between the (desired) erased state E0 and a lowest program state (i.e., the first program state P1). Here, a lowest acceptable threshold voltage value for a memory cell programmed to the first program state P1 is equal to a verify voltage (Vvrf). Assuming this outcome, program/read fail(s) may occur during subsequent 2-bit mode programming/reading of the un-programmed page PAGE2.

To address this problem, the operating method illustrated in FIG. 3, for example, provides a nonvolatile memory device consistent with certain embodiments of the inventive concept with the capability of discriminating in relation to an established "shift check voltage" (Vsc), and count a number of "off-cells" (e.g., memory cells having respective threshold voltages in the region 280 of FIG. 4). That is, the shift check voltage (Vsc) may be applied to the word lien associated with the un-programmed PAGE2 and the number of resulting off-cells counted. In certain embodiments, the shift check voltage (Vsc) may be lower than the verify voltage (Vvrf) indicating a lowest boundary of the program state P1. In other embodiments, the shift check voltage (Vsc) may be lower than the read voltage (Vr) normally used to distinguish between the erased state E0' and the (adjacent) lowest program state P1.

As illustrated in FIG. 5, a check operation capable of determining the existence of a threshold voltage distribution shift by the counting of off-cells may be periodically performed by embodiments of the inventive concept.

Figure 5A:
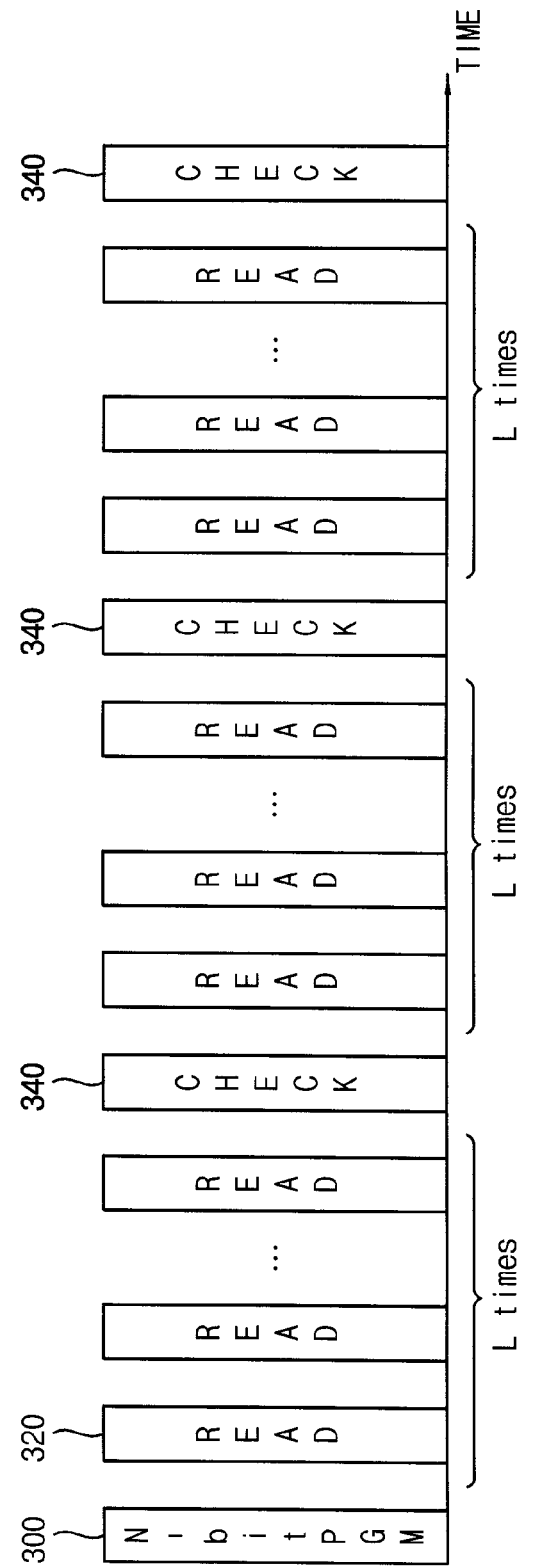
FIG. 5, inclusive of FIGS. 5A, 5B, 5C and 5D, is a conceptual diagram illustrating over an arbitrary time period the execution of a check operation that checks for shifting of threshold voltage distributions by counting off-cells in the method of FIG. 3.

For example, as illustrated in FIG. 5A, a check operation may be performed each time a predetermined number of read operations directed to memory cells of the memory block are performed. That is, assuming a program operation 300 using the N-bit mode to program the first page PAGE1, a check operation 340 directed to the second page PAGE2 may be performed each time L read operations 320 are executed in relation to the first page PAGE1, where "L" is a natural number.

Figure 5B:
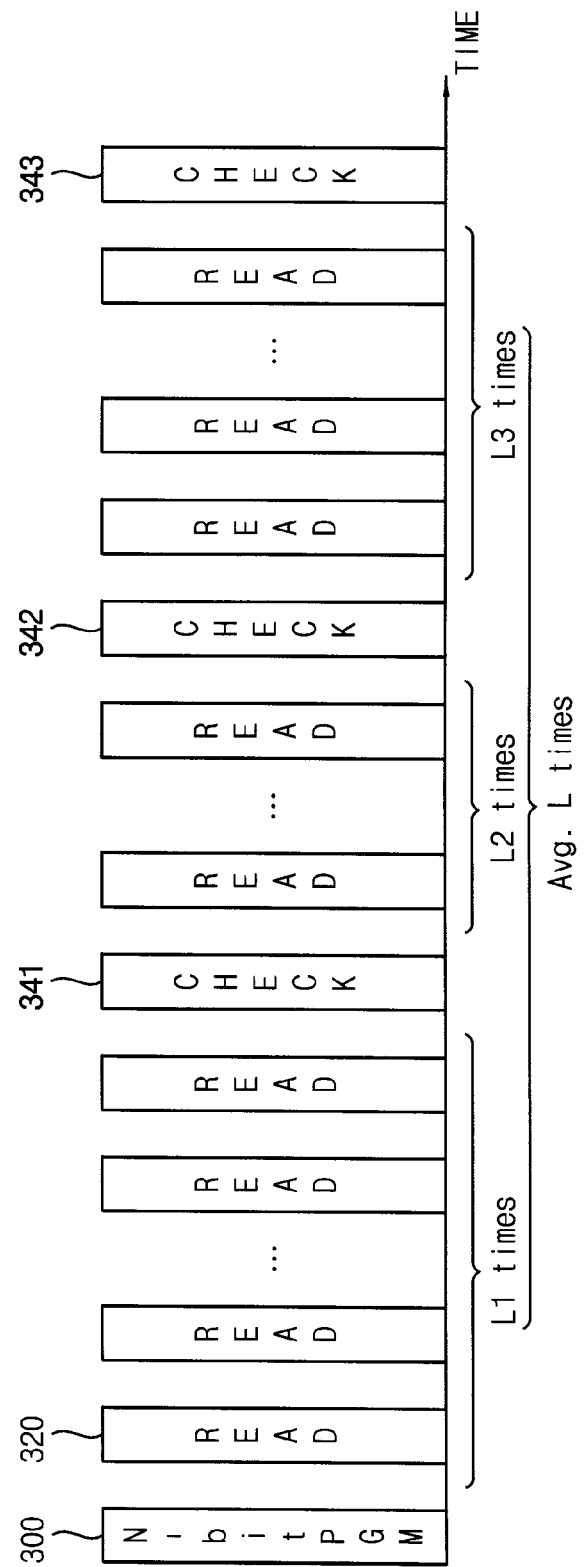

As illustrated in FIG. 5B, the check operation may be performed after a randomly determined number of read operations are executed in relation to the memory block, wherein some established "average" of the randomly determined number is set. For example, following the program operation 300 using the N-bit mode to program the first page PAGE1, a first check operation 341 directed to the second page PAGE2 may be performed after L1 read operation(s) are executed in relation to the first page PAGE1. After the first check operation 341, a second check operation 342 directed to the second page PAGE2 may be performed after an additional L2 read operation(s) are executed in relation to the first page PAGE1. Further, after the second check operation 342, a third check operation 343 directed to the second page PAGE2 may be performed after an additional L3 read operation(s) are executed with respect to the page PAGE1. Although each of the natural numbers L1, L2 and L3 is randomly determined, an average of L1, L2 and L3 will be consistent with set average value 1'. Thus, even if the executed read operations 320 are performed according to a given pattern, the check operations (e.g., 341, 342, 343) directed to the second page PAGE2 will not be determined in their application period by the given pattern.

Figure 5C:
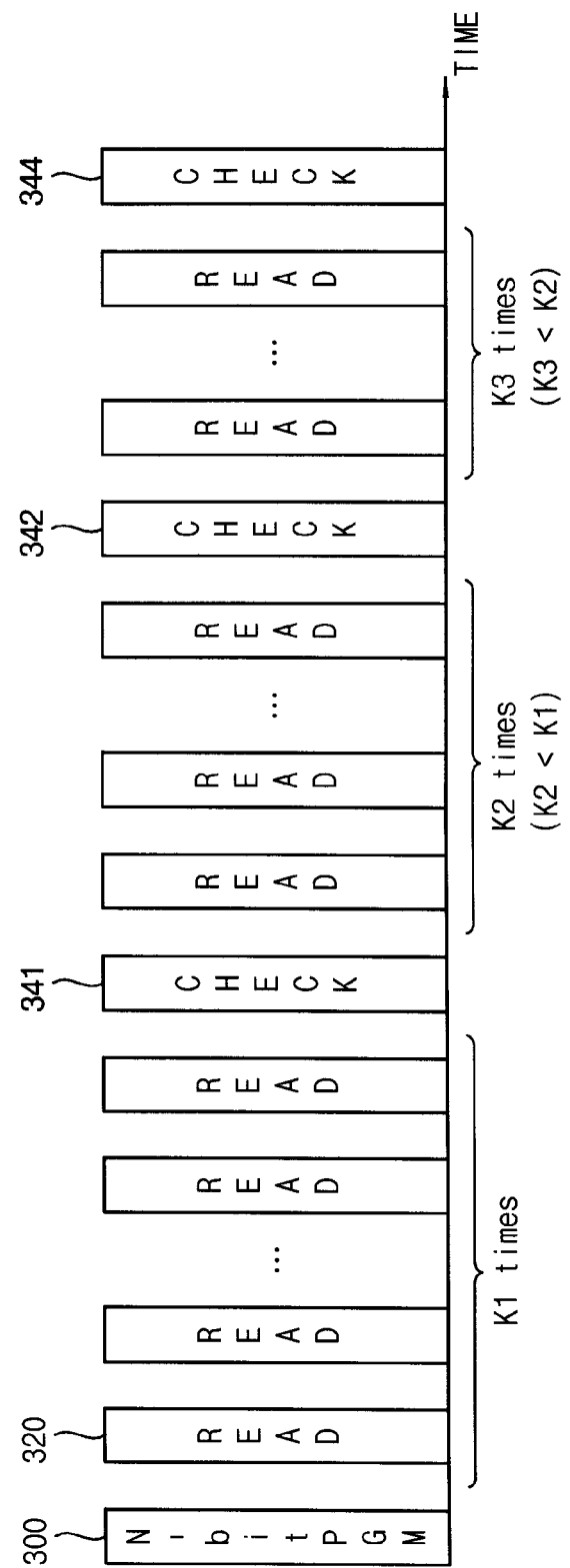

As illustrated in FIG. 5C, the check operation may be performed at decreasing intervals. For example, after the program operation 300 using the N-bit mode to program the first page PAGE1, a first check operation 341 directed to the second page PAGE2 may be performed after K1 read operations are executed in relation to the first page PAGE1. After the first check operation 341, a second check operation 342 directed to the second page PAGE2 may be performed after K2 (K2 being less than K1) read operations are executed in relation to the first page PAGE1. Further, after the second check operation 342, a third check operation 343 directed to the second page PAGE2 may be performed after K3 (K3 being less than K2) read operations are executed in relation to the first page PAGE1.

Thus, as an increasing number of read operations 320 are directed to the first page PAGE1, the occurrence likelihood of a threshold voltage distribution shift rises for the second page PAGE2. Accordingly, check operations may be performed more frequently.

Figure 5D:
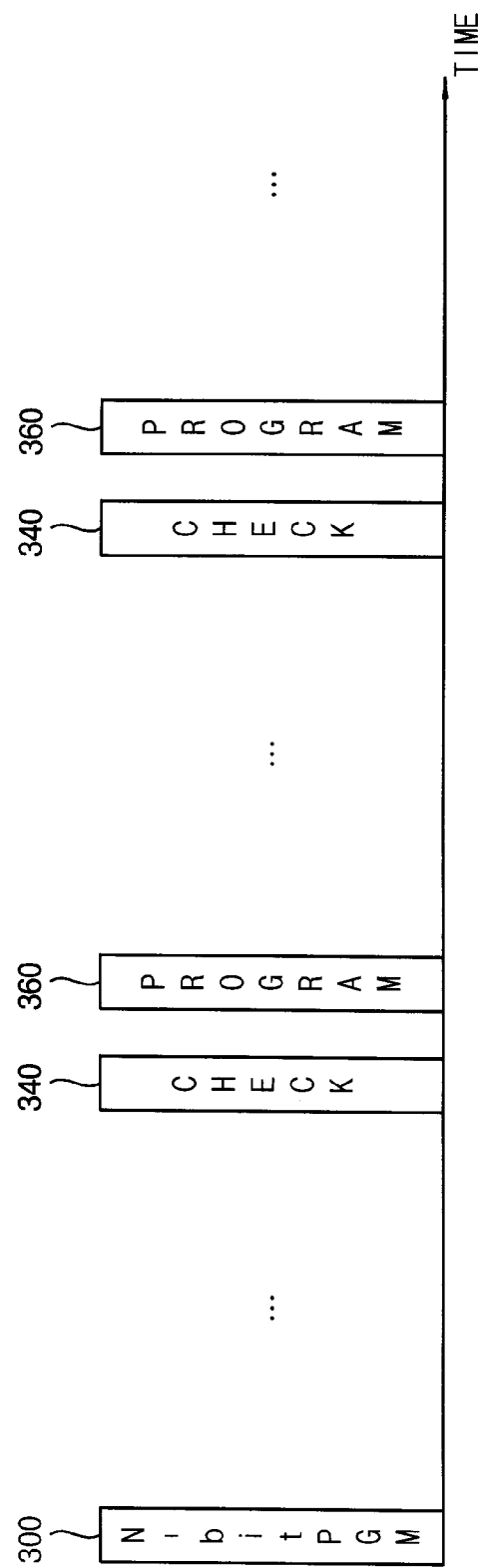

As illustrated in FIG. 5D, the check operation may be performed in response to a program command indicating that the second page is to be programmed. Hence, a particular check operation directed to an un-programmed page may be performed only when necessary to ensure the stability of erased state threshold voltage distributions for the memory cells of the soon-to-be-programmed page. For example, after the program operation 300 using the N-bit mode programs the first page PAGE1, the nonvolatile memory device may be configured to receive a program command that requests a subsequent program operation 360 be directed to a previously un-programmed second page PAGE2. In response to the program command, the nonvolatile memory device will first perform the check operation 340 for the second page PAGE2 before executing the subsequent program operation 360.

Thus, as has been established by the foregoing, there are many approaches to determining whether a threshold voltage distribution shift has occurred for an un-programmed page. In certain approaches consistent with operating methods contemplated by embodiments of the inventive concept, a nonvolatile memory device may count a number of off-cells and compare the counted number of off-cells to a limit. Accordingly in the example illustrated in FIG. 3, so long as the counted number of off-cells remains less than the established limit (S240=NO), the nonvolatile memory device may consider the un-programmed page to be "normal" (i.e., having a threshold voltage distribution that is not severely shifted), and continue to use the N-bit mode to program un-programmed pages of the memory block. However, when the number of counted off-cells does equals or exceeds the limit (S240=YES), the M-bit mode must be used to program the un-programmed page (S260).

Figure 6:
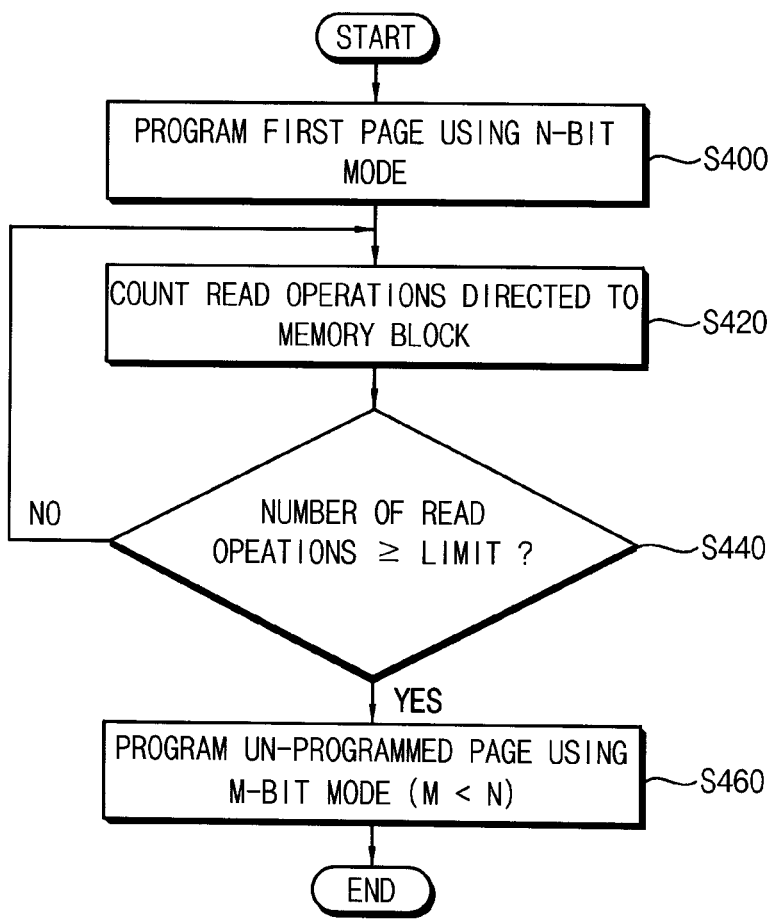
FIGS. 6 and 7 are respective flow charts summarizing method(s) of operating a nonvolatile memory device according to certain other embodiments of the inventive concept.

FIG. 6 is a flow chart summarizing in another example a method of operating a nonvolatile memory device according to embodiments of the inventive concept.

Referring to FIG. 6, at least a first page in a memory block including un-programmed pages is programmed using the N-bit mode (S400). Then, one or more read operations are directed to the at least first page. These read operations are counted (S420), and a counted number of read operations is compared to an established limit (S440). In certain embodiments of the inventive concept, the counting of read operations will be performed by the nonvolatile memory device itself, while in other embodiments an operatively associated memory controller may be used to count the read operations.

So long as the counted number of read operations remains less than the limit (S440=NO), the nonvolatile memory device may assume normal operation in relation to the un-programmed pages and continue to use the N-bit programming/read mode. However, when the counted number of read operations equals or exceeds the limit (S440=YES), the nonvolatile memory device determine that the threshold voltage distribution of un-programmed page(s) is shifted, and while therefore program the un-programmed page using the M-bit mode (S260).

Figure 7:
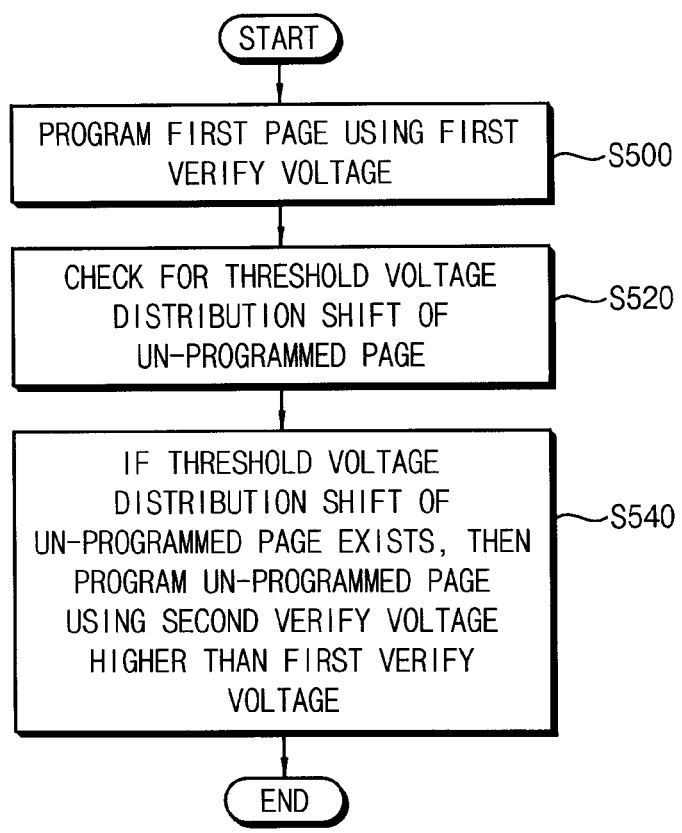
Figure 9:
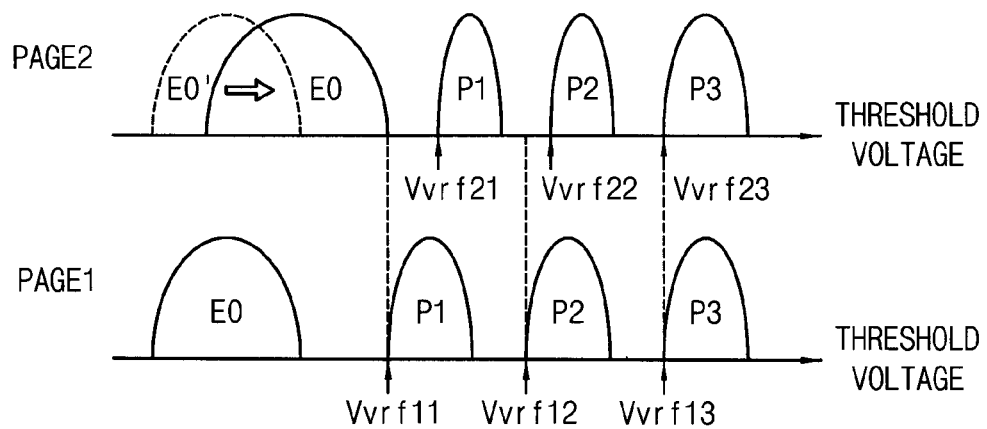
FIG. 9 is a conceptual diagram illustrating the use of adjusted verify voltages as the result of applying a method of operating a nonvolatile memory device according to embodiments of the inventive concept.
Figure 10A:
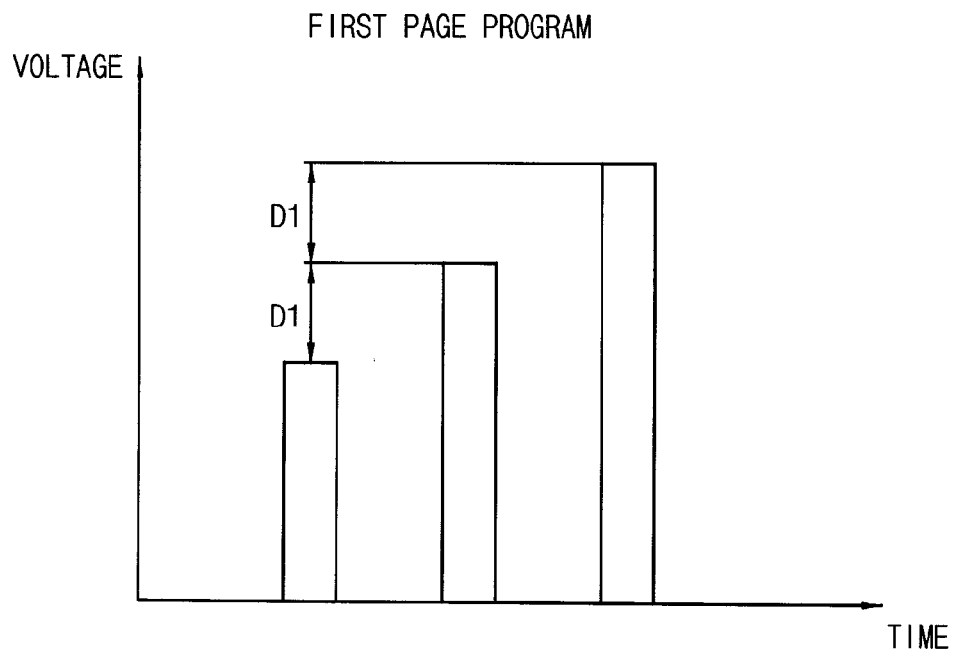
FIG. 10, inclusive of FIGS. 10A and 10B, is a voltage diagram illustrating incremental step pulse voltages that may be used during a program operation within the method of FIG. 7.
Figure 10B:
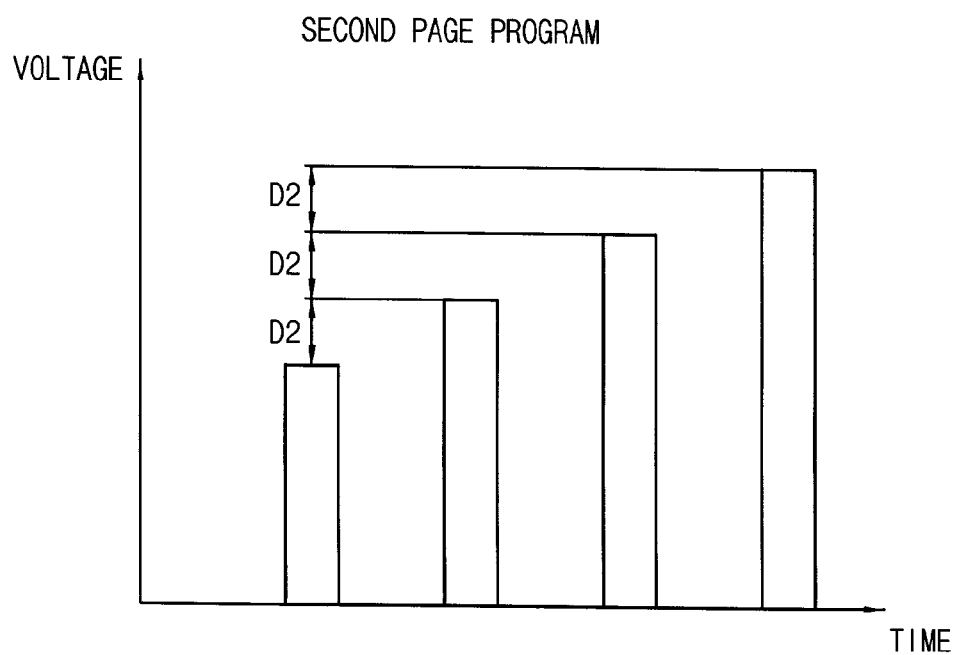

FIG. 7 is a flow chart summarizing in another example a method of operating a nonvolatile memory device according to embodiments of the inventive concept. FIG. 8 is a conceptual diagram shifting of threshold voltage distributions and application of the method of FIG. 7 to this situation. FIG. 9 is a conceptual diagram further illustrating the use of certain verify voltages in program operations associated with the method of FIG. 7. FIG. 10 is a voltage diagram further illustrating various incremental step pulse voltages that may be used during the method of FIG. 7.

Referring to FIG. 7, in a nonvolatile memory device including a memory block having a plurality of pages respectively coupled to a plurality of word lines, at least one first page of the plurality of pages included in the memory block is programmed using at least one first verify voltage (S500). After the first page is programmed, a read operation for the first page may be performed at the memory block, and thus a threshold voltage distribution of at least one second page of the memory block that is not programmed may be shifted due to a read disturbance.

Figure 8A:
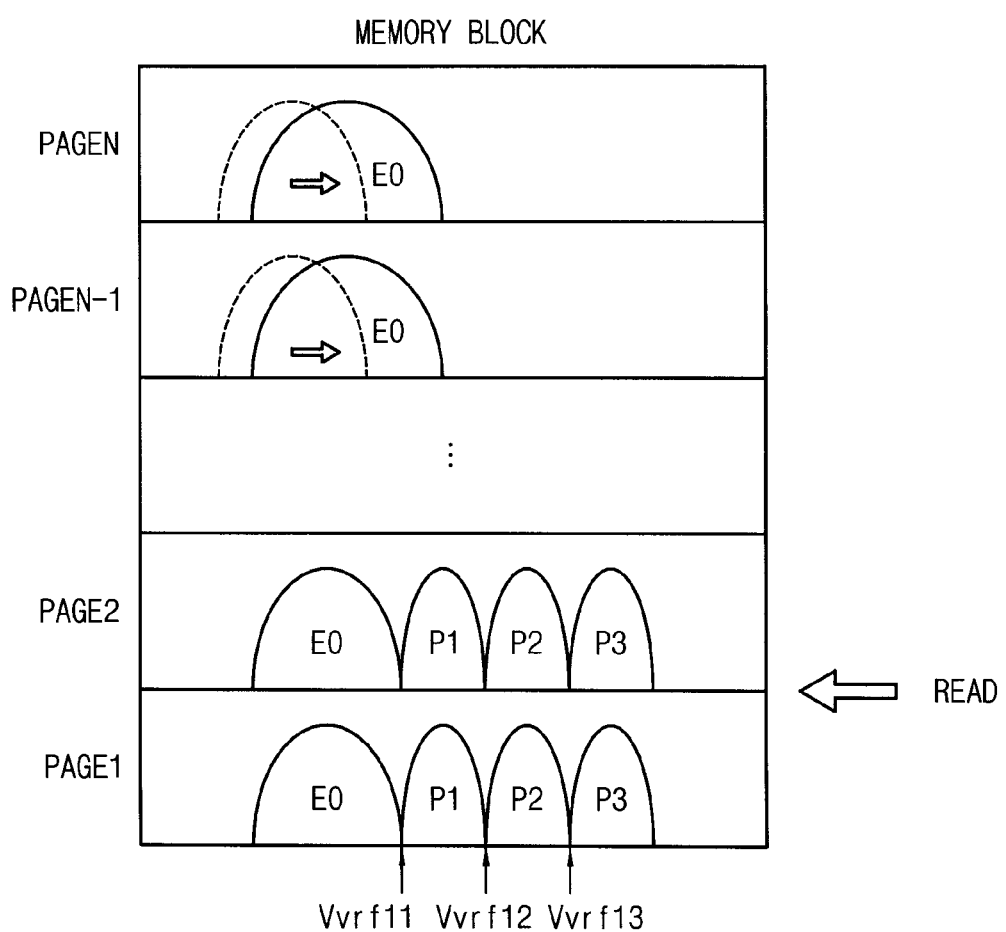
FIG. 8, inclusive of FIGS. 8A and 8B, is a conceptual diagram illustrating the read disturbance shifting of threshold voltage distributions for respective pages in a memory block and the results of applying a method of operating a nonvolatile memory device according to embodiments of the inventive concept.

In the example further illustrated in FIGS. 8A and 8B, at least one first page PAGE1 and PAGE2 is programmed using at least one first verify voltage Vvrf11, Vvrf12 and Vvrf13. Thereafter, when a read operation for the at least one first page PAGE1 and PAGE2 is performed, read pass voltages (Vread) are applied to word lines coupled to at least one second page PAGEN-1 and PAGEN that is not programmed, and threshold voltage distributions of the non-programmed pages PAGEN-1 and PAGEN may be undesirably shifted or broadened by the read pass voltages.

A potential threshold voltage distribution shift for the un-programmed second page may now be checked (S520). If the threshold voltage distribution shift for the un-programmed page exists, then the nonvolatile memory device will program the un-programmed page in relation to at least one second verify voltage that is higher than the first verify voltage (S540).

That is, as illustrated in FIG. 8B, in a case where the threshold voltage distribution of the at least one second page PAGEN-1 and PAGEN that is not programmed is shifted by more than the predetermined amount by the read operation for the at least one first page PAGE1 and PAGE2 that is programmed using the at least one first verify voltage Vvrf11, Vvrf12 and Vvrf13, the nonvolatile memory device may program the at least one second page PAGEN-1 and PAGEN using the at least one second verify voltage Vvrf21, Vvrf22 and Vvrf23 higher than the at least one first verify voltage Vvrf11, Vvrf12 and Vvrf13. In some embodiments, each second verify voltage Vvrf21, Vvrf22 and Vvrf23 may be higher than a corresponding first verify voltage Vvrf11, Vvrf12 and Vvrf13. In other embodiments, the second verify voltage Vvrf23 corresponding to the highest program state P3 is substantially the same as the first verify voltage Vvrf13 corresponding to the highest program state P3, and second verify voltages Vvrf21 and Vvrf22 corresponding to other program states P1 and P2 may be higher than first verify voltages Vvrf11 and Vvrf12 corresponding to the other program states P1 and P2, respectively.

Accordingly, even if at least a portion of the threshold voltage distribution of the second page PAGEN-1 and PAGEN in the erased state E0 is shifted to a voltage higher than the first verify voltage Vvrf11 corresponding to the lowest program state P1, the second page PAGEN-1 and PAGEN is programmed using the second verify voltage Vvrf21 higher than the first verify voltage Vvrf11, thereby preventing a program fail and/or a read fail for the second page PAGEN-1 and PAGEN.

As further illustrated in FIG. 9, the first page PAGE1 may be programmed using the first verify voltages Vvrf11, Vvrf12 and Vvrf13. If the read operation for the first page PAGE1 is repeatedly performed, the threshold voltage distribution of the second page PAGE2 in the erased state E0' may be shifted. In a case where at least a portion of the shifted threshold voltage distribution of the second page PAGE2 in the shifted erased state E0 is higher than the first verify voltage Vvrf1 corresponding to the first program state P1, a program fail and/or a read fail may occur during a program operation and/or a read operation for the second page PAGE2. However, in the method of operating the nonvolatile memory device according to embodiments, in a case where the threshold voltage distribution of the second page PAGE2 is shifted by more than the predetermined amount, the second page PAGE2 may be programmed using the second verify voltages Vvrf21, Vvrf22 and Vvrf23 having intervals (or voltages differences) narrower than intervals of the first verify voltages Vvrf11, Vvrf12 and Vvrf13 used in the program operation for the first page PAGE1. For example, the second verify voltage Vvrf23 corresponding to the highest program state P3 may have the same voltage level as the first verify voltage Vvrf11 corresponding to the highest program state P3, and the second verify voltages Vvrf21 and Vvrf22 corresponding to other program states P1 and P2 may have voltage levels higher than those of the first verify voltages Vvrf11 and Vvrf12 corresponding to the other program states P1 and P2. Accordingly, even if at least a portion of the shifted threshold voltage distribution of the second page PAGE2 in the shifted erased state E0 is higher than the first verify voltage Vvrf11 corresponding to the first program state P1, the second page PAGE2 is programmed using the second verify voltage Vvrf21 higher than the first verify voltage Vvrf11, thereby preventing a program fail and/or a read fail for the second page PAGE2. In some embodiments, the second verify voltage Vvrf23 corresponding to the highest program state P3 may have the same voltage level as the first verify voltage Vvrf11 corresponding to the highest program state P3. In this case, a program disturbance during a program operation for the highest program state P3 may not be increased.

As still further illustrated by FIG. 9, the second page PAGE2 may be programmed to the program states P1, P2 and P3 narrower than the program states P1, P2 and P3 of the first page PAGE1. To achieve this narrow threshold voltage distribution, a second incremental step pulse voltage used in a program operation for the second page PAGE2 may increase, at each program loop, by a second step voltage that is lower than a first step voltage of a first incremental step pulse voltage used in a program operation for the first page PAGE1. Thus, as further illustrated in FIGS. 10A and 10B, the second step voltage D2 of the second incremental step pulse voltage used in the program operation for the second page PAGE2 may be lower than the first step voltage D1 of the first incremental step pulse voltage used in the program operation for the first page PAGE1. Accordingly, the second page PAGE2 may be programmed to have the narrow program states P1, P2 and P3.

As has been previously noted, when an un-programmed page of a conventional nonvolatile memory device experiences a read disturb sufficient to cause a threshold voltage distribution shift, the already programmed pages of the constituent memory block must be copied to another memory block, and the memory block marked as a bad block. Accordingly, a memory space associated with the bad block is lost to the use of the conventional nonvolatile memory device.

In contrast, certain methods of operating a nonvolatile memory device according to embodiments of the inventive concept allow for the continued use of such a memory block together with its un-programmed pages. As a result, the memory space provided by the memory block is not lost.

Figure 11:
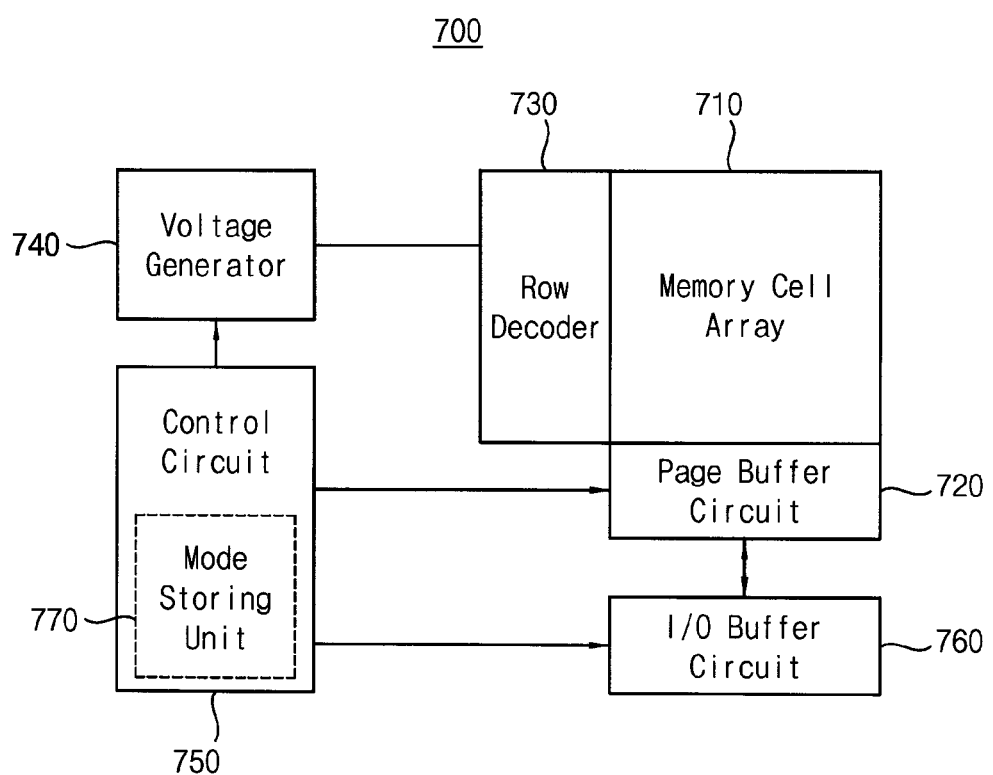
FIG. 11 is a block diagram illustrating a nonvolatile memory device according to certain embodiments of the inventive concept.

FIG. 11 is a block diagram illustrating a nonvolatile memory device that may be operated in accordance with a method consistent with one or more embodiments of the inventive concept.

Referring to FIG. 11, a nonvolatile memory device 700 includes a memory cell array 710, a page buffer circuit 720, a row decoder 730, a voltage generator 740, an input/output buffer circuit 760, and a control circuit 750. The nonvolatile memory device 700 may be a flash memory device, a phase random access memory (PRAM), a resistive random access memory (RRAM), a magnetic random access memory (MRAM), a ferroelectric random access memory (FRAM), etc.

The memory cell array 710 may include a plurality of memory cells coupled to a plurality of word lines and a plurality of bit lines. As described below with reference to FIGS. 12, 13 and 14, the plurality of memory cells may be NAND or NOR flash memory cells, and may be arranged in a two dimensional memory cell array or a three dimensional (or vertical) memory cell array. Further, as noted above, the memory cells may be MLC. The MLC may be programmed according to a program scheme in a write mode may include various program schemes such as a shadow program scheme, a reprogram scheme, an on-chip buffered program scheme, or the like.

The page buffer circuit 720 may be coupled to the bit lines, and may store write data to be programmed in the memory cell array 710 or read data that are sensed from the memory cell array 710. That is, the page buffer circuit 720 may be operated as a write driver or a sensing amplifier according to an operation mode of the nonvolatile memory device 700. For example, the page buffer circuit 720 may be operated as the write driver in a write mode and as the sensing amplifier in a read mode. The input/output buffer circuit 760 may receive data to be programmed in the memory cell array 710 from an external memory controller, and may transmit data read from the memory cell array 710 to the memory controller.

The row decoder 730 may be coupled to the word lines, and may select at least one of the word lines in response to a row address. The voltage generator 740 may generate word line voltages, such as a program voltage, a pass voltage, a verification voltage, an erase voltage, a read voltage, etc. according to a control of the control circuit 750. The control circuit 750 may control the page buffer circuit 720, the row decoder 730, the voltage generator 740 and the input/output buffer circuit 760 to perform data storing, erasing and reading operations for the memory cell array 710.

In some embodiments, the nonvolatile memory device 700 may include a mode storing unit 770. The mode storing unit 770 may be located inside or outside the control circuit 750. The nonvolatile memory device 700 may program at least one first page included in a memory block, and may check a shift of a threshold voltage distribution of at least one second page that is not programmed. If the threshold voltage distribution of the second page is shifted by more than a predetermined amount, the nonvolatile memory device 700 may set the second page to a mode of M bits less than the N bits, and may store mode information for the second page in the mode storing unit 770. Thereafter, when a program operation for the second page is performed, the nonvolatile memory device 700 may program and read the second page in the M-bit mode based on the mode information for the second page stored in the mode storing unit 770. In other embodiments, the nonvolatile memory device 700 may not include the mode storing unit 770, and a memory controller may include a mode storing unit for storing mode information for respective pages.

Figure 12:
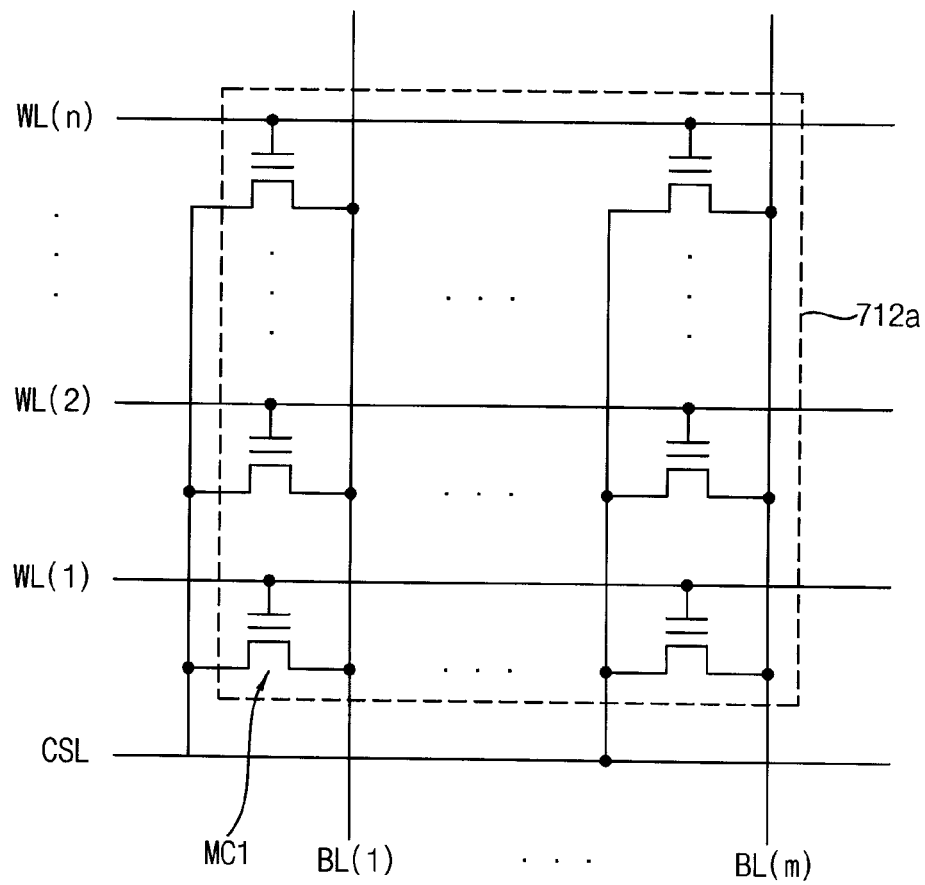
FIGS. 12, 13 and 14 are respective diagrams further illustrating the memory cell array of the nonvolatile memory device of FIG. 11.
Figure 13:
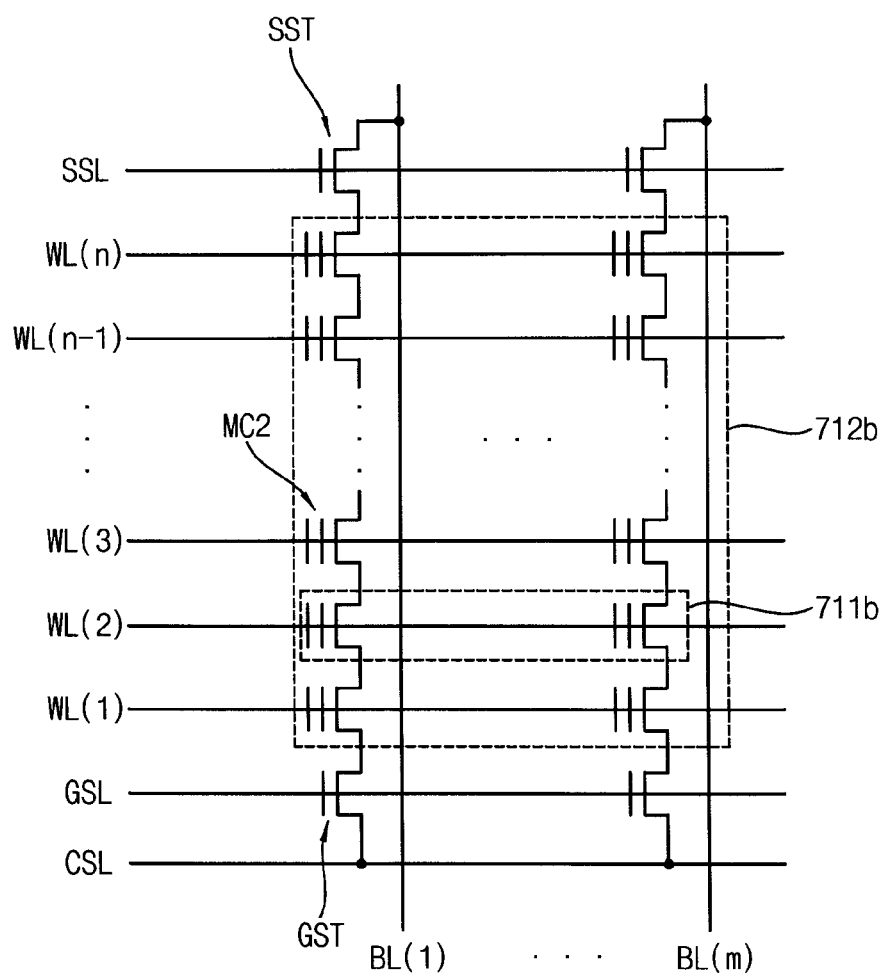
Figure 14:
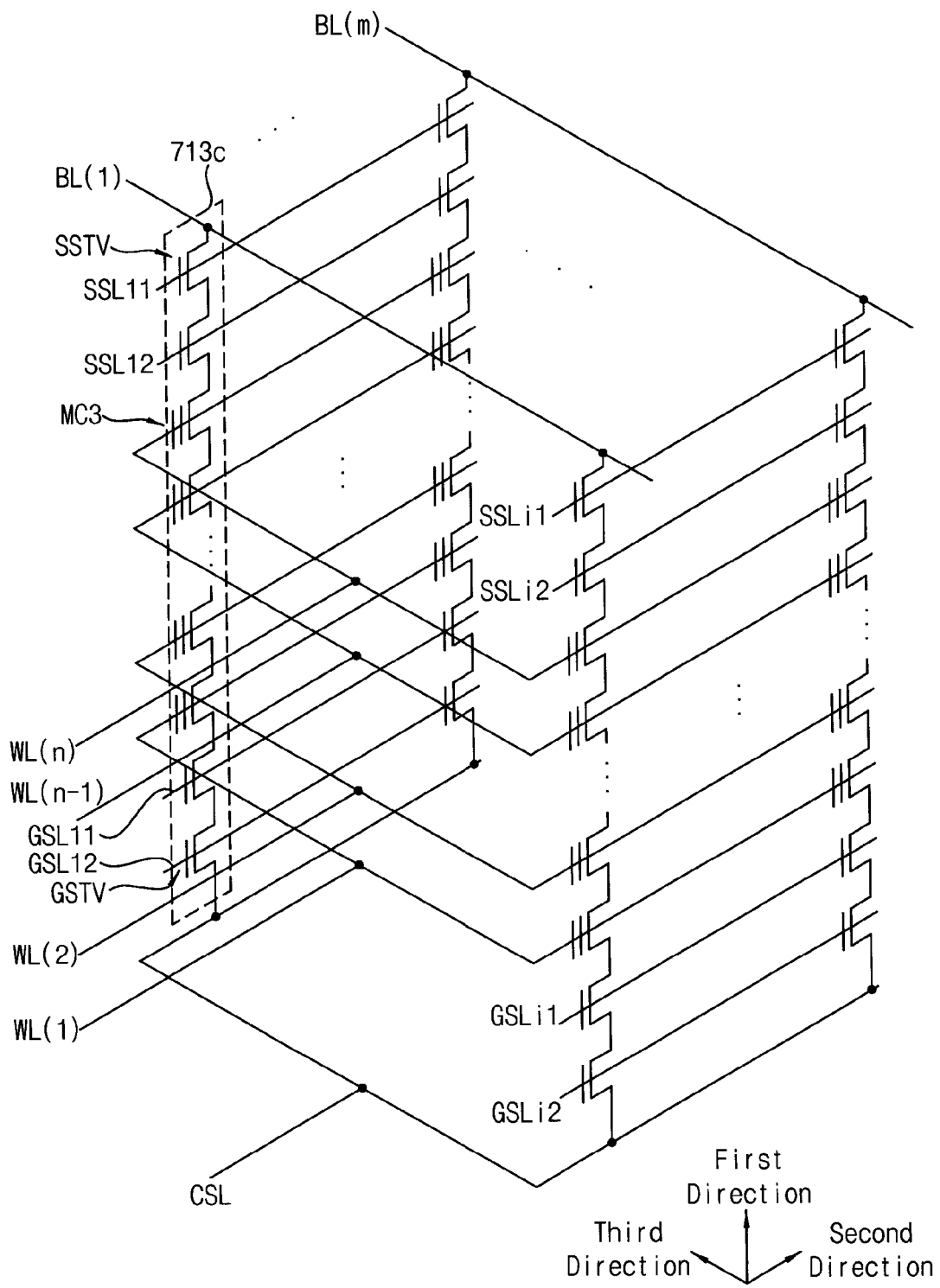

FIGS. 12, 13 and 14 are respective diagrams illustrating examples of a memory cell array that may be included in the nonvolatile memory device of FIG. 11. FIG. 12 is a circuit diagram illustrating an example of a memory cell array included in a NOR flash memory device. FIG. 13 is a circuit diagram illustrating an example of a memory cell array included in a NAND flash memory device, and FIG. 14 is a circuit diagram illustrating an example of a memory cell array included in a vertical flash memory device.

Referring to FIG. 12, a memory cell array 710a may include a plurality of memory cells MC1. The memory cells MC1 arranged in the same row may be disposed in parallel between one of bit lines BL(1), ..., BL(m) and a common source line CSL, and may be coupled in common to one of word lines WL(1), WL(2), ..., WL(n). For example, the memory cells arranged in a first row may be disposed in parallel between a first bit line BL(1) and the common source line CSL. Gate electrodes of the memory cells arranged in the first row may be coupled in common to a first word line WL(1). The memory cells MC1 may be controlled according to a level of a voltage applied to the word lines WL(1), ..., WL(n). The NOR flash memory device including the memory cell array 710a may perform write and read operations in units of byte or word, and may perform an erase operation in units of block 712a.

Referring to FIG. 13, a memory cell array 710b may include string selection transistors SST, ground selection transistors GST and memory cells MC2. The string selection transistors SST may be coupled to the bit lines BL(1), ..., BL(m), and the ground selection transistors GST may be coupled to the common source line CSL. The memory cells MC2 arranged in the same row may be disposed in series between one of the bit lines BL(1), ..., BL(m) and the common source line CSL, and the memory cells MC2 arranged in the same column may be coupled in common to one of the word lines WL(1), WL(2), WL(3), ..., WL(n-1), WL(n). That is, the memory cells MC2 may be coupled in series between the string selection transistors SST and the ground selection transistors GST, and the 16, 32 or 64 word lines may be disposed between the string selection line SSL and the ground selection line GSL.

The string selection transistors SST are coupled to the string selection line SSL such that the string selection transistors SST may be controlled according to a level of a voltage applied from the string selection line SSL. The memory cells MC2 may be controlled according to a level of a voltage applied to the word lines WL(1), ..., WL(n).

The NAND flash memory device including the memory cell array 710b may perform write and read operations in units of page 711b and an erase operation in units of block 712b. In some embodiments, each of page buffers may be coupled to even and odd bit lines one by one. In this case, the even bit lines form an even page, the odd bit lines form an odd page, and the write operations for the memory cells MC2 of the even and odd pages may be performed by turns and sequentially.

Referring to FIG. 14, a memory cell array 710c may include a plurality of strings 713c having a vertical structure. The plurality of strings 713c may be formed in a second direction such that a string row may be formed. A plurality of string rows may be formed in a third row such that a string array may be formed. Each of the strings 713c may include ground selection transistors GSTV, memory cells MC3 and string selection transistors SSTV which are disposed in series in a first direction between the bit lines BL(1), . . . , BL(m) and the common source line CSL.

The ground selection transistors GSTV may be coupled to the ground selection lines GSL11, GSL12, . . . , GSLi1, GSLi2, respectively, and the string selection transistors SSTV may be connected to the string selection lines SSL11, SSL12, . . . , SSLi1, SSLi2, respectively. The memory cells MC3 arranged on the same layer may be coupled in common to one of the word lines WL(1), WL(2), . . . , WL(n-1), WL(n). The ground selection lines GSL11, . . . , GSLi2 and the string selection lines SSL11, . . . , SSLi2 may extend in the second direction and may be formed along the third direction. The word lines WL(1), . . . , WL(n) may extend in the second direction and may be formed along the first and third directions. The bit lines BL(1), . . . , BL(m) may extend in the third direction and may be formed along the second direction. The memory cells MC3 may be controlled according to a level of a voltage applied to the word lines WL(1), . . . , WL(n).

Since the vertical flash memory device including the memory cell array 710c includes NAND flash memory cells, like the NAND flash memory device of FIG. 13, the vertical flash memory device performs the write and read operations in units of page and the erase operation in units of block.

In some embodiments, it may be implemented that two string selection transistors included in one string 713c are coupled to one string selection line, and two ground selection transistors included in one string are coupled to one ground selection line. In other embodiments, it may be implemented that one string includes one string selection transistor and one ground selection transistor.

Figure 15:
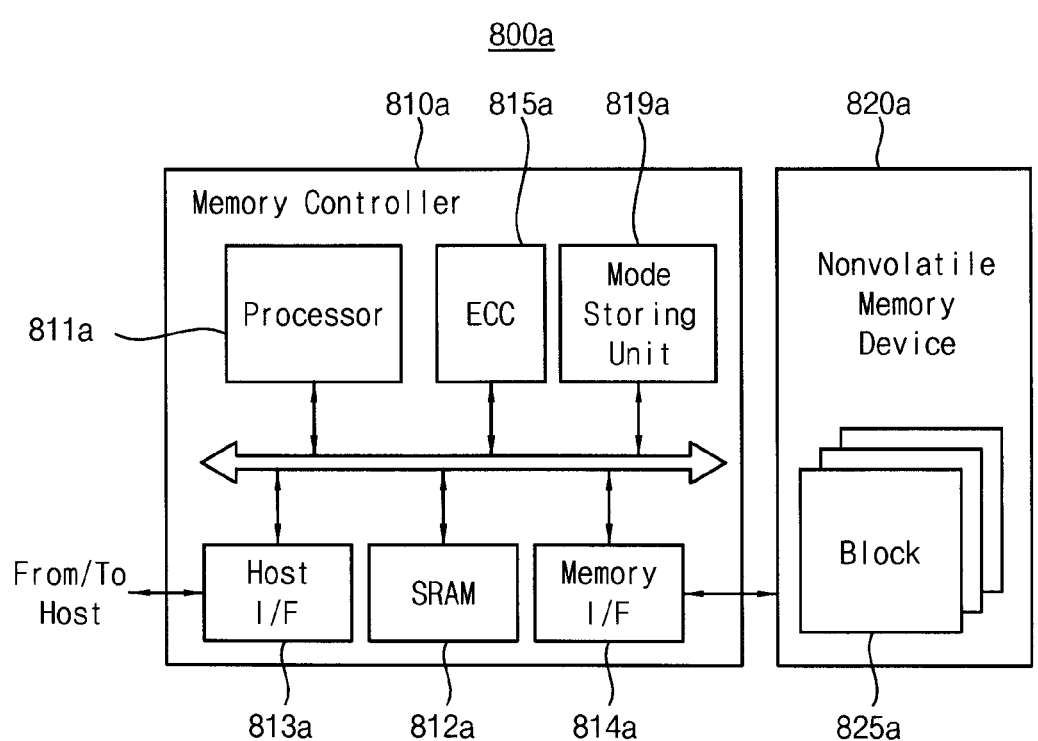
FIGS. 15, 16, 17, 18 and 19 are respective block diagrams illustrating various systems that may include a nonvolatile memory device operated in accordance with certain embodiments of the inventive concept.

FIG. 15 is a block diagram illustrating an example of a memory system including a nonvolatile memory device and a memory controller according to embodiments.

Referring to FIG. 15, a memory system 800a includes a memory controller 810a and a nonvolatile memory device 820a.

The nonvolatile memory device 820a includes a memory cell array 825a including a plurality of memory blocks 825a each having a plurality of pages. The nonvolatile memory device 820a may program at least one first page of each memory block 825a in an N-bit mode, and may check a shift of a threshold voltage distribution of at least one second page that is not programmed. In some embodiments, the nonvolatile memory device 820a may perform a check operation for the second page in response to a predetermined command from the memory controller 810a. For example, the nonvolatile memory device 820a may receive a read command or a predetermined check command from the memory controller 810a, and the nonvolatile memory device 820a may transfer data of the second page to the memory controller 810a in response to the command. The memory controller 810a may count off-cells among memory cells of the second based on the transferred data from the nonvolatile memory device 820a. In other embodiments, the memory controller 810a may count read commands that are transferred to the nonvolatile memory device 820a to check the shift of the threshold voltage distribution of the second page.

If the threshold voltage distribution of the second page is shifted by more than a predetermined amount, the memory controller 810a may set the second page to a mode of M bits less than the N bits, and may store mode information for the second page in the mode storing unit 819a. Thereafter, when a program operation for the second page is performed, the memory controller 810a may transfer, as a program command and a read command for the second page, an M-bit mode program command and an M-bit mode read command to the nonvolatile memory device 820a based on the mode information for the second page stored in the mode storing unit 819a. Although FIG. 15 illustrates an example where the mode storing unit 819a and the buffer memory 812a are separate units, in some embodiments, the buffer memory 812a perform a function of the mode storing unit 819a.

The memory controller 810a may control the nonvolatile memory device 820a. The memory controller 810a may control data transfer between an external host and the nonvolatile memory device 820a. The memory controller 810a may include a processor 811a, such as a central processing unit (CPU), a buffer memory 812a, a host interface 813a, a memory interface 814a and an ECC block 815a. The memory controller 810a may further include the mode storing unit 819a for storing the mode information for respective pages.

The processor 811a may perform operations for the data transfer. In some embodiments, the buffer memory 812a may be implemented by a static random access memory (SRAM). In other embodiments, a dynamic random access memory (DRAM), a phase random access memory (PRAM), a ferroelectric random access memory (FRAM), a resistive random access memory (RRAM), a magnetic random access memory (MRAM), etc. According to embodiments, the buffer memory 812a may be located inside or outside the memory controller 810a.

The host interface 813a may be coupled to the host, and the memory interface 814a may be coupled to the nonvolatile memory device 820a. The processor 811a may communicate with the host via the host interface 813a. For example, the host interface 813a may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, the processor 811a may communicate with the nonvolatile memory device 820a via the memory interface 814a. In some embodiments, the ECC block 815a may perform ECC encoding and ECC decoding by using a Bose-Chaudhuri-Hocquenghem (BCH) code. In other embodiments, the ECC block 815a may perform the ECC encoding and the ECC decoding by using a low density parity check (LDPC) code. In still other embodiments, the ECC block 815a may perform the ECC encoding and the ECC decoding by using a turbo code, a Reed-Solomon code, a convolution code, a recursive systematic code (RSC), a coded modulation, such as a trellis-coded modulation (TCM), a block coded modulation (BCM), etc., or other error correction codes. According to embodiments, the memory controller 810a may be built in the nonvolatile memory device 820a, or the memory controller 810a and the nonvolatile memory device 820a may be implemented as separate chips.

The memory system 800a may be implemented as a memory card, a solid state drive, etc. In some embodiments, the nonvolatile memory device 820a, the memory controller 810a and/or the memory system 800a may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 16:
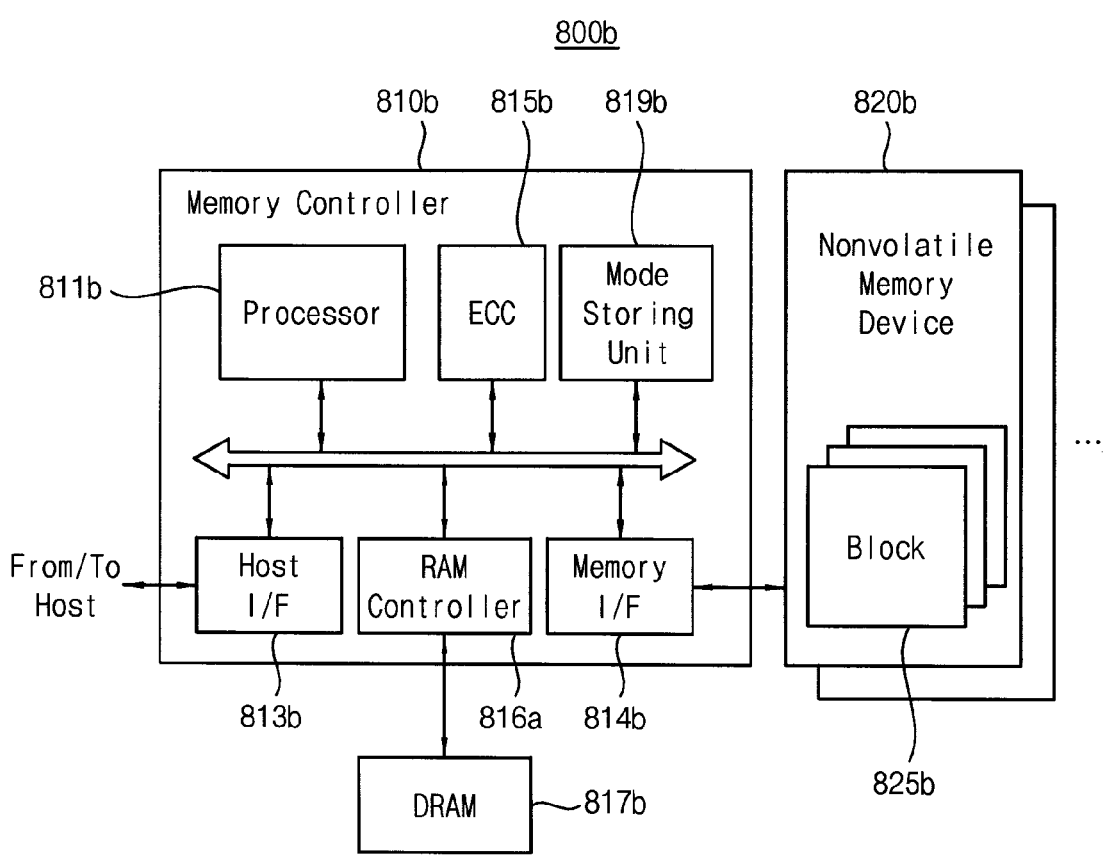

FIG. 16 is a block diagram illustrating another example of a memory system including a nonvolatile memory device and a memory controller according to embodiments.

Referring to FIG. 16, a memory system 800b includes a memory controller 810b, a nonvolatile memory device 820b and a buffer memory 817b. In some embodiments, the buffer memory 817b may be a dynamic random access memory (DRAM), and may be located outside the memory controller 810b. The nonvolatile memory device 820b may include memory blocks 820b, and the memory controller 810b may include a processor 811b, a host interface 813b, a memory interface 814b, an ECC block 815b and a random access memory (RAM) controller 816b for controlling the buffer memory 817b. The memory controller 810b may further include the mode storing unit 819b for storing the mode information for respective pages. The memory system 800b of FIG. 16 may have similar configurations and operations to a memory system 800a of FIG. 15, except that the buffer memory 817b is located outside the memory controller 810b.

Figure 17:
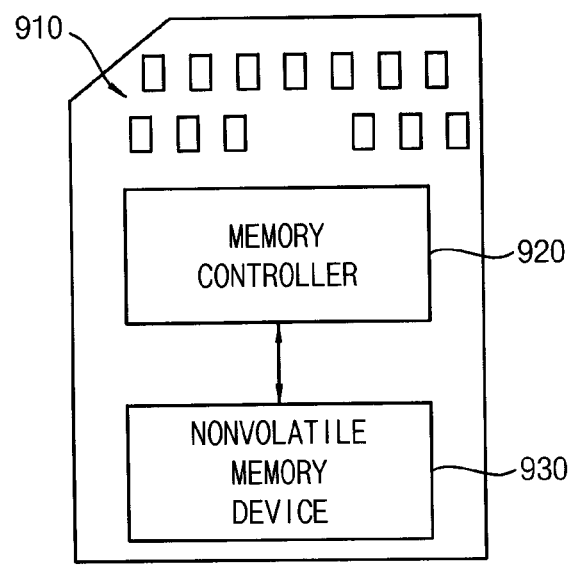

FIG. 17 is a diagram illustrating a memory card including a memory system according to embodiments.

Referring to FIG. 17, a memory card 900 may include a plurality of connecting pins 910, a memory controller 920 and a nonvolatile memory device 930.

The connecting pins 910 may be coupled to a host to transfer signals between the host and the memory card 900. The connecting pins 910 may include a clock pin, a command pin, a data pin and/or a reset pin.

The memory controller 920 may receive data from the host, and may store the received data in the nonvolatile memory device 930.

The nonvolatile memory device 930 may program at least one first page included in a memory block in an N-bit mode, and may check a shift of a threshold voltage distribution of at least one second page that is not programmed. If the threshold voltage distribution of the second page is shifted by more than a predetermined amount, the nonvolatile memory device 930 may set, program and read the second page in a mode of M bits less than the N bits. Accordingly, the memory block may be efficiently used, and a storage space of the nonvolatile memory device 930 may be increased.

For example, the memory card 900 may include a multimedia card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In some embodiments, the memory card 900 may be attachable to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 18:
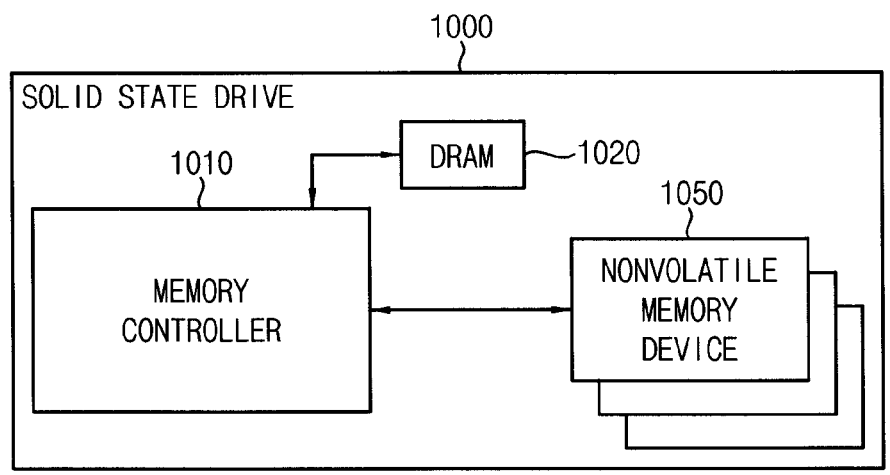

FIG. 18 is a diagram illustrating a solid state drive including a memory system according to embodiments.

Referring to FIG. 18, a solid state drive (SSD) 1000 includes a memory controller 1010, a buffer memory 2420 and a plurality of nonvolatile memory devices 1050.

The memory controller 1010 may receive data from a host. The memory controller 1010 may store the received data in the plurality of nonvolatile memory devices 1050. The buffer memory 2420 may temporarily store data transferred between the host and the plurality of nonvolatile memory devices 1050, and may be implemented by a DRAM located outside the memory controller 1010.

Each nonvolatile memory device 1050 may program at least one first page included in a memory block in an N-bit mode, and may check a shift of a threshold voltage distribution of at least one second page that is not programmed. If the threshold voltage distribution of the second page is shifted by more than a predetermined amount, the nonvolatile memory device 1050 may set, program and read the second page in a mode of M bits less than the N bits. Accordingly, the memory block may be efficiently used, and a storage space of the nonvolatile memory device 1050 may be increased.

In some embodiments, the solid state drive 1000 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 19:
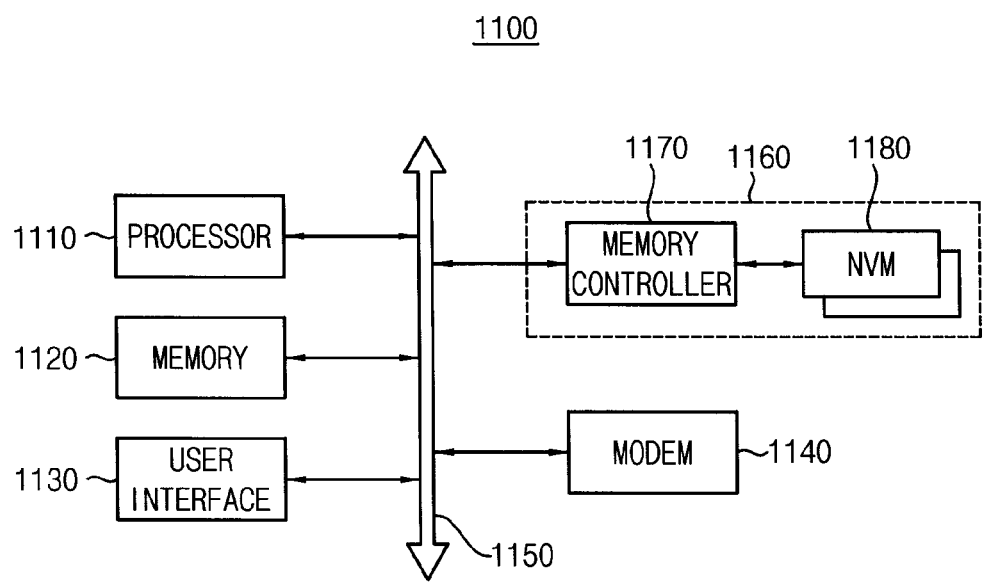

FIG. 19 is a diagram illustrating a computing system according to embodiments.

Referring to FIG. 19, a computing system 1100 includes a processor 1110, a memory device 1120, a user interface 1130, a bus 1150 and a memory system 1160. In some embodiments, the computing system 1100 may further include a modem 1140, such as a baseband chipset.

The processor 1110 may perform specific calculations or tasks. For example, the processor 1110 may be a microprocessor, a central processing unit (CPU), a digital signal processor, or the like. The processor 1110 may be coupled to the memory device 1120 via a bus 1150, such as an address bus, a control bus and/or a data bus. For example, the memory device 1120 may be implemented by a DRAM, a mobile DRAM, a SRAM, a PRAM, a FRAM, a RRAM, a MRAM and/or a flash memory. Further, the processor 1110 may be coupled to an extension bus, such as a peripheral component interconnect (PCI) bus, and may control the user interface 1130 including at least one input device, such as a keyboard, a mouse, a touch screen, etc., and at least one output device, a printer, a display device, etc. The modem 1140 may perform wired or wireless communication with an external device. The nonvolatile memory device 1180 of the memory system 1160 may be controlled by a memory controller 1170 to store data processed by the processor 1110 or data received via the modem 1140. In some embodiments, the computing system 1100 may further include a power supply, an application chipset, a camera image processor (CIS), etc.

The inventive concept may be applied to any nonvolatile memory device, such as a flash memory device, and devices and systems including the nonvolatile memory device. For example, the inventive concept may be applied to various electronic devices, such as a memory card, a solid state drive, a desktop computer, a laptop computer, a tablet computer, a mobile phone, a smart phone, a music player, a PDA, a PMP, a digital television, a digital camera, a portable game console, etc.

The foregoing embodiments are illustrative in nature. Although these embodiments have been described in some enabling detail, those skilled in the art will readily appreciate that many modifications are possible without materially departing from the scope of the following claims.

What is claimed is:

1. A method of operating a nonvolatile memory device having a memory cell array of nonvolatile memory cells configured to operate as multi-level memory cells (MLC) and arranged in a memory block including a plurality of pages respectively coupled to a plurality of word lines extending across the memory cell array, the method comprising:
    programming N-bit data to MLC of at least a first page among the plurality of pages using a N-bit mode, wherein "N" is a natural number greater than 1 and the plurality of pages includes an un-programmed page;
    checking whether a threshold voltage distribution shift exists for the un-programmed page; and
    upon determining that the threshold voltage distribution shift exits, programming M-bit data to the MLC of the un-programmed page using a M-bit mode, where "M" is a natural number less than N.

2. The method of claim 1, wherein checking whether the threshold voltage distribution shift exists for the un-programmed page comprises:
    counting a number of off-cells having threshold voltages higher than a shift check voltage among MLC of the un-programmed page by applying the shift check voltage to one of the plurality of word lines corresponding to the un-programmed page.

3. The method of claim 2, wherein the counting of the number of off-cells is performed according to a period.

4. The method of claim 3, wherein the period is defined by a fixed number of read operations directed to the MLC of the at least first page.

5. The method of claim 3, wherein the period is defined by a randomly selected number of read operations directed to the MLC of the at least first page.

6. The method of claim 5, wherein an average of an increasing number of the randomly selected numbers converges towards a predetermined average.

7. The method of claim 3, wherein the period is defined by a gradually decreasing number of read operations following the programming of the at least first page using the N-bit mode.

8. The method of claim 1, wherein the checking of whether the threshold voltage distribution shift exists for the un-programmed page is performed in response to receiving a command indicating that the un-programmed page is to be programmed, and before the un-programmed page is programmed.

9. The method of claim 2, wherein the shift check voltage is lower than a read voltage used to discriminate between an erased state and a lowest program state among a plurality of program states used to program the MLC.

10. The method of claim 2, wherein the shift check voltage is lower than a verify voltage identifying a lower boundary of a threshold voltage distribution associated with a lowest program state among a plurality of program states used to program the MLC.

11. The method of claim 2, further comprising:
    comparing the counted number of off-cells to a limit; and
    determining that the threshold voltage distribution shift exists when the number of the counted off-cells is greater than or equal to the limit.

12. A method of operating a nonvolatile memory device having a memory cell array of nonvolatile memory cells configured to operate as multi-level memory cells (MLC) and arranged in a memory block including a plurality of pages respectively coupled to a plurality of word lines extending across the memory cell array, the method comprising:
    programming N-bit data to MLC of a first page among the plurality of pages using a N-bit programming mode, wherein "N" is a natural number greater than 1 and the plurality of pages includes an un-programmed page;
    after programming the N-bit data to the MLC of the first page, counting a number of read operations directed to the MLC of the first page, and comparing the number of counted read operations to a limit; and
    upon determining that the number of counted read operations exceeds the limit, programming M-bit data to MLC of the un-programmed page using a M-bit programming mode, where "M" is a natural number less than N.

13. The method of claim 12, wherein the N-bit programming mode uses first verify voltages defined by a first voltage difference, and the M-bit programming mode uses second verify voltages defined by a second voltage difference less than the first voltage difference.

14. The method of claim 12, wherein the N-bit programming mode uses a first incremental step pulse voltage that increases by a first step voltage, and the M-bit programming mode uses a second incremental step pulse voltage that increases by a second step voltage less than the first step voltage.

15. A method of operating system including a memory controller controlling the operation of a nonvolatile memory device, wherein the nonvolatile memory device includes a memory cell array of nonvolatile memory cells configured to operate as multi-level memory cells (MLC) and arranged in a memory block including a plurality of pages respectively coupled to a plurality of word lines extending across the memory cell array, the method comprising:
    programming pages among of the plurality of pages using a N-bit programming mode until a threshold voltage distribution shift for an un-programmed page among the plurality of pages is determined, and thereafter programming the un-programmed page using a M-bit programming mode, where "M" and "N" are natural numbers and M is less than N.

16. The method of claim 15, wherein the threshold voltage distribution shift is determined by counting a number of off-cells having threshold voltages higher than a shift check voltage among MLC of the un-programmed page by applying the shift check voltage to one of the plurality of word lines corresponding to the un-programmed page.

17. The method of claim 15, wherein the threshold voltage distribution shift is determined upon receiving a command in the nonvolatile memory device from the memory controller indicating that the un-programmed page is to be programmed.

* * * * *